United States Patent
Hashimoto

(10) Patent No.: US 6,734,906 B1
(45) Date of Patent: May 11, 2004

(54) IMAGE PICKUP APPARATUS WITH PHOTOELECTRIC CONVERSION PORTIONS ARRANGED TWO DIMENSIONALLY

(75) Inventor: Seiji Hashimoto, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/386,345

(22) Filed: Aug. 31, 1999

(30) Foreign Application Priority Data

Sep. 2, 1998 (JP) .......................... 10-248729
Sep. 2, 1998 (JP) .......................... 10-248730

(51) Int. Cl.[7] .......................... H04N 3/14; H04N 5/335; H04N 9/04; H04N 9/083
(52) U.S. Cl. .......................... 348/302; 348/300; 348/301; 348/308; 348/281
(58) Field of Search .......................... 348/308, 281, 348/301, 300, 302

(56) References Cited

U.S. PATENT DOCUMENTS

| | | | |
|---|---|---|---|
| 4,768,085 A | 8/1988 | Hashimoto | 358/48 |
| 4,876,601 A | 10/1989 | Hashimoto et al. | 358/213.26 |
| 4,910,597 A | 3/1990 | Harada et al. | 358/213.15 |
| 4,910,599 A | 3/1990 | Hashimoto | 358/213.26 |
| 4,914,519 A | 4/1990 | Hashimoto et al. | 358/213.18 |
| 4,942,474 A * | 7/1990 | Akimoto et al. | 348/301 |
| 4,967,067 A | 10/1990 | Hashimoto et al. | 250/208.1 |
| 4,985,758 A | 1/1991 | Hashimoto | 358/44 |
| 5,162,912 A | 11/1992 | Ueno et al. | 358/213.16 |
| 5,214,272 A * | 5/1993 | Ueno | 250/208.1 |
| 5,262,850 A | 11/1993 | Hashimoto | 358/500 |
| 5,288,988 A | 2/1994 | Hashimoto et al. | 250/208.1 |
| 5,315,412 A | 5/1994 | Mihara et al. | 358/512 |
| 5,424,529 A | 6/1995 | Hashimoto et al. | 250/208.1 |
| 5,521,640 A * | 5/1996 | Prater | 348/273 |
| 5,587,814 A | 12/1996 | Mihara et al. | 358/512 |
| 5,742,059 A * | 4/1998 | Hassler | 250/370.09 |
| 5,751,189 A * | 5/1998 | Shyu et al. | 330/9 |
| 5,856,686 A * | 1/1999 | Watanabe et al. | 257/291 |
| 6,107,655 A * | 8/2000 | Guidash | 257/233 |
| 6,160,281 A * | 12/2000 | Guidash | 257/292 |
| 6,486,913 B1 * | 11/2002 | Afghahi et al. | 348/308 |

FOREIGN PATENT DOCUMENTS

| | | |
|---|---|---|
| JP | 1-245769 | 9/1989 |
| JP | 4-281683 | 10/1992 |
| JP | 9-247546 | 9/1997 |

* cited by examiner

*Primary Examiner*—Wendy R. Garber
*Assistant Examiner*—James Hannett
(74) *Attorney, Agent, or Firm*—Fitzpatrick, Cella, Harper & Scinto

(57) ABSTRACT

In order to reduce a chip area, an image pickup apparatus includes unit cells arranged in a plurality of lines, each having a plurality of photoelectric conversion portions disposed at least in a horizontal direction and a common circuit to which signals from the plurality of photoelectric conversion portions are input and a subtracting circuit shared by respective photoelectric conversion portions of at least one of the unit cells.

6 Claims, 24 Drawing Sheets

$a_1 > a_2$

IMAGE PICKUP APPARATUS WITH PHOTOELECTRIC CONVERSION PORTIONS ARRANGED TWO DIMENSIONALLY

BACKGROUND OF THE INVENTION

1. Field of the Invention

The present invention relates to an image pickup apparatus for detecting image information of an object, and an image pickup system using the image pickup apparatus.

2. Related Background Art

A CMOS area sensor is one of amplification type sensors, which has a CMOS amplification circuit in each pixel.

The CMOS area sensor is superior to a CCD type area sensor, in terms of random access, a variety of functions and a small power consumption.

A CCD type area sensor has a large power consumption, and photoelectrically converted signals are sequentially transferred to the output circuit so that random access is difficult. A CMOS area sensor can output an image signal by selecting a desired pixel, so that it has a low power consumption and low noises and is easy to be fabricated.

If there is a variation in the characteristics of pixel amplifiers of a CMOS area sensor, it is required to use storage units in order to compensate for the variation. However, if each pixel is provided with a storage unit, a storage unit mount area becomes large and the cost rises. An example of an image pickup apparatus having storage units for compensating for such a variation will be described. A variation in the characteristics of pixel amplifiers can be suppressed by subtracting a noise signal read from the pixel from a pixel signal.

FIGS. 1 to 3 are schematic circuit diagrams showing examples of a conventional variation compensation circuit of an image pickup apparatus. The structure shown in FIG. 2 is disclosed in JP-A-1-245769, and the structure shown in FIG. 3 is disclosed in JP-A-9-247546.

Referring to FIG. 1, a capacitor CS and a capacitor CN for storing a signal and a noise of each pixel are connected via transistors MS and MN to a vertical output line to which the output terminals of a plurality of pixels are connected. A signal and noise stored in the capacitors CS and CN are transferred to a horizontal output line when transistors MC1 and MC2 are turned on by a horizontal shift register (H•SR), and the noise is removed from the signal by a subtraction amplifier.

In the structure shown in FIG. 2, the noise is subtracted from the signal by reset means MP1 and MP2 connected to the electrodes of capacitors Cp and Cp, and a noise removed signal is temporarily stored in a capacitor CS. In order to remove the noise, while the output electrode side of the capacitor Cp is maintained at a constant potential, the noise is output to the input electrode side of the capacitor Cp, and after the output electrode side of the capacitor Cp is made in a floating state, the signal is input to the input electrode side of the capacitor Cp. Since the input electrode side of the capacitor Cp changes its potential by a (signal−noise) potential and similarly the output electrode side of the capacitor Cp changes its potential by a (signal−noise) potential, a signal with the noise removed can be output. A signal stored in the capacitor CS is transferred to the horizontal output line when the transistor MC is turned on by a horizontal shift register (H•SR).

In the structure shown in FIG. 3, the noise read from the vertical output line is subtracted from the signal read from the vertical output line and the noise removed signal is temporarily stored in the capacitor CS. In order to remove the noise, transistors Mt and Mr are turned on and reset, and thereafter during a noise output period, a negative pulse is applied to the capacitor Cp to transfer the charges over the channel potential $\phi n$ of the transistor MS to the capacitor CS, which charges are drained by turning on the transistor Mt. Again during the signal output period, a negative pulse is applied to the capacitor Cp to transfer the charges over the channel potential $\phi s$ of the transistor MS to the capacitor CS. The charges transferred to the capacitor CS are $Cp \times (\phi s - \phi n)$ which correspond to the noise removed signal.

In such an image pickup apparatus, two capacitors are provided at the minimum at one pixel line (one vertical output line). The capacitance of a capacitor is determined by the thickness of a dielectric layer and the electrode area. The capacitors generally occupy several tens % of the chip area.

In the structure, particularly the structure shown in FIG. 1, an amplifier for subtracting the noise from the signal is required for each pixel and the power consumption becomes large. If signals of a plurality of horizontal lines are read at the same time in order to lower a read speed, the temporary storage capacitor is required to have a large capacitance, resulting in a large chip area. In the image pickup apparatus shown in FIG. 2, even if the capacitor CS is omitted and the signal and noise are output to the horizontal output line without being temporarily stored, a circuit for subtracting the noise is required for each line, resulting in a large chip area.

A recent digital still camera has several million pixels and an increased consumption power. The number of images capable of being stored therefore reduces and a user is requested to incur a high battery cost.

After the year 2000, an infrastructure of IMT-2000 capable of high speed data communications will be prepared and image communications will prevail. In order to prevail such mobile image communications, a sensor and a peripheral circuit of a low consumption power and a low cost are desired.

SUMMARY OF THE INVENTION

It is an object of the present invention to reduce a chip area.

In order to achieve the above object, according to aspect of the invention, there is provided an image pickup apparatus comprising unit cells arranged in a plurality of lines, each unit cell including a plurality of photoelectric conversion portions arranged at least in a horizontal direction and a common circuit to which signals from the plurality of photoelectric conversion portions are input; and subtracting means shared by respective photoelectric conversion portions of at least one of the unit cells.

According to another aspect of the invention, there is provided an image pickup apparatus comprising: a plurality of photoelectric conversion pixels; and subtracting means shared by at least two photoelectric conversion pixels adjacent in the plurality of photoelectric conversion pixels.

According to another apsect of the invention, there is provided an image pickup apparatus comprising: unit cells arranged in a plurality of lines, each including a plurality of photoelectric conversion portions disposed at least in a horizontal direction and a common circuit to which signals from the plurality of photoelectric conversion portions are input; and signal holding means shared by respective photoelectric conversion portions of at least one of the unit cells.

According to another aspect of the invention, there is provided an image pickup apparatus comprising: a plurality of photoelectric conversion pixels; and signal holding means shared by at least two photoelectric conversion pixels adjacent in the plurality of photoelectric conversion pixels, wherein the signal holding means stores in parallel first and second signals generated in the photoelectric conversion pixel.

The other objects and features of the invention will become more apparent from the following detailed description of preferred embodiments when read in conjunction with the accompanying drawings.

DETAILED DESCRIPTION OF THE PREFERRED EMBODIMENTS

Embodiments of the invention will be detailed with reference to the accompanying drawings.

Figure 1:
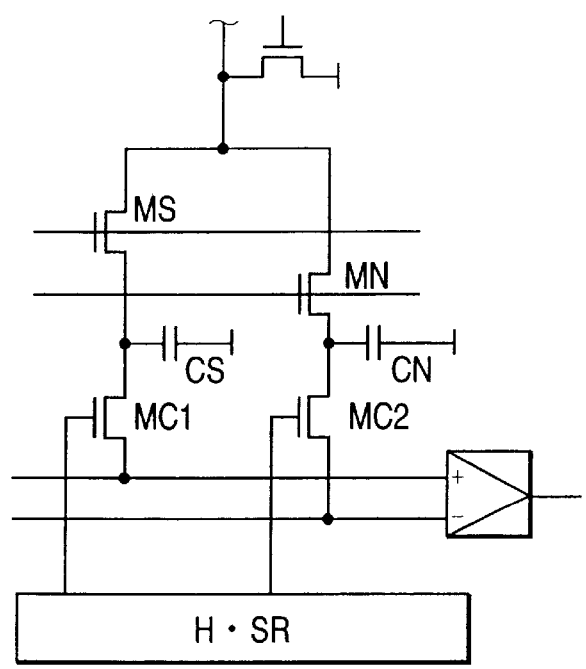
FIG. 1 is a schematic circuit diagram showing an example of a noise eliminating circuit of a conventional image pickup apparatus.
Figure 2:
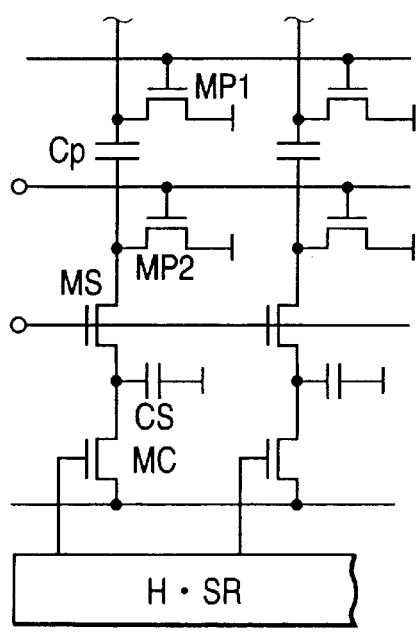
FIG. 2 is a schematic circuit diagram showing another example of a noise eliminating circuit of a conventional image pickup apparatus.
Figure 4:
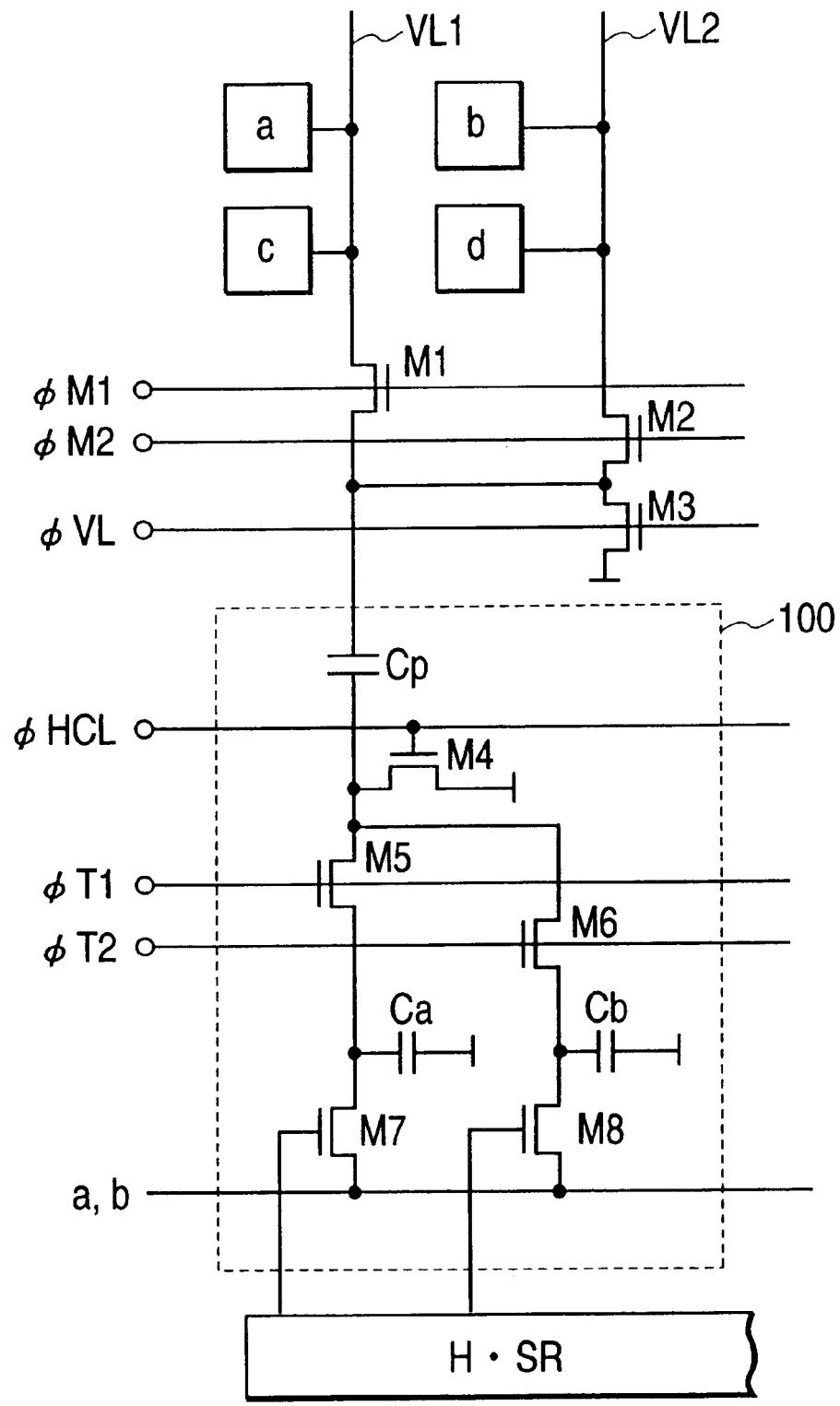
FIG. 4 is a schematic circuit diagram showing the structure of an image pickup apparatus according to a first embodiment of the invention.
Figure 5:
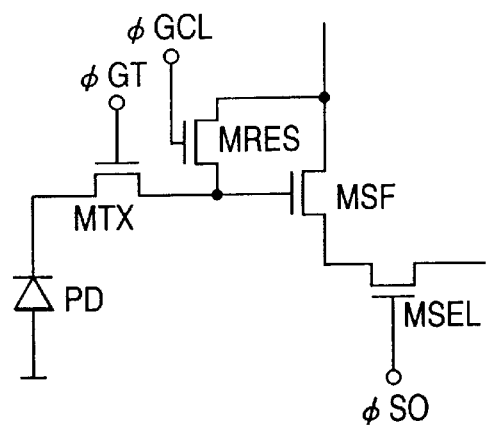
FIG. 5 is a diagram showing the structure of a photoelectric conversion pixel.

FIG. 4 is a schematic circuit diagram showing the structure of an image pickup apparatus according to the first embodiment of the invention. FIG. 5 is a circuit diagram of a photoelectric conversion pixel. The fundamental structure of the noise eliminating circuit is the same as that shown in FIG. 2.

As shown in FIG. 4, photoelectric conversion pixels a and c are connected to a vertical output line VL1, and photoelectric conversion pixels b and d are connected to a vertical output line VL2. The vertical output line VL1 is connected via a transistor M1 to a noise eliminating capacitor Cp, and the vertical output line VL2 is connected via a transistor M2 to the noise eliminating capacitor Cp. The input side of the capacitor Cp is connected to a transistor M3, and the output side thereof is connected to a transistor M4 so that the input and output electrodes of the capacitor Cp can be set to predetermined potentials.

In order to remove the noise, while the output electrode side of the capacitor Cp is maintained at a constant potential, for example, the noise of the pixel a is output to the input electrode side of the capacitor Cp by turning the transistor M1 on, and after the output electrode side of the capacitor Cp is made in a floating state, the signal of the pixel a is input to the input electrode side of the capacitor Cp. Since the input electrode side of the capacitor Cp changes its potential by a (signal−noise) potential and similarly the output electrode side of the capacitor Cp changes its potential by a (signal−noise) potential, a signal with the noise removed can be output. In a similar manner, the noise of the pixel b is removed from the signal.

The noise removed signal of the pixel a can be stored in a capacitor Ca by turning on a transistor M5, and a noise removed signal of the pixel b can be stored in a capacitor Cb by turning on a transistor M6. By sequentially turning on transistors M7 and M8 by a horizontal shift register (H•SR), the noise removed signal of the pixel a and the noise removed signal of the pixel b can be output to the horizontal output line. Reference numeral 100 represents a noise elimination/signal storage unit.

In this embodiment, since the noise eliminating capacitor Cp is shared by the two vertical output lines, only three capacitors are used for two vertical output lines.

FIG. 5 is a circuit diagram of a photoelectric conversion pixel. As shown in FIG. 5, the photoelectric conversion pixel includes: a photodiode PD as a photoelectric conversion portion, a transfer means MTX for transferring a signal charge from the photodiode PD; an amplification means MSF for amplifying and outputting the transferred signal charge; a reset means MRES for resetting the pixel, and a select means MSEL for selecting the pixel. The transfer means MTX is turned on by a control signal φGT when the signal from the photodiode PD is transferred to an input portion (gate) of the amplification means MSF. The select means MSEL is turned on by a select signal φSO when a signal corresponding to the signal charge transferred to the gate of the amplification means MSF is read to the vertical output line. Before the signal from the photodiode PD is transferred to the input portion (gate) of the amplification means MSF, the reset means MRES is turned on by the reset signal φGCL so that the input portion of the amplification means MSF is reset and the noise is sent via the select means MSEL to the vertical output line.

Figure 6:
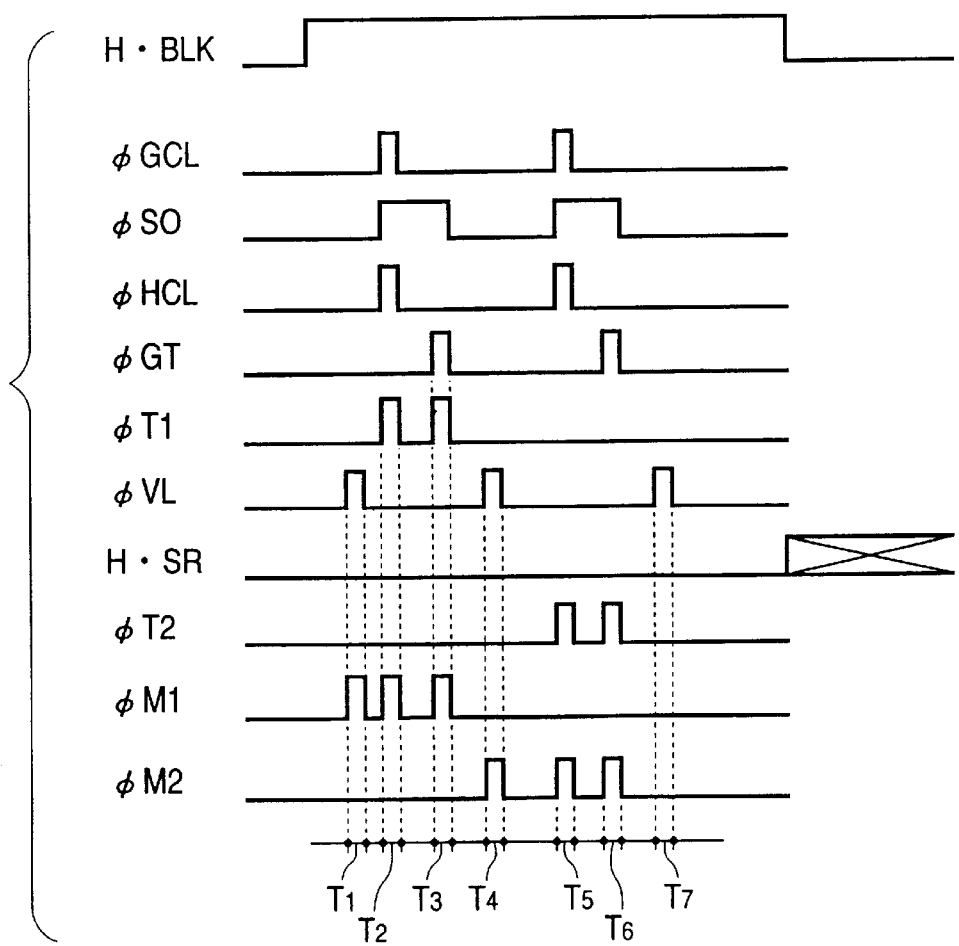
FIG. 6 is a timing chart illustrating the operation of the image pickup apparatus shown in FIG. 5.

FIG. 6 is a timing chart illustrating the operation of the image pickup apparatus.

Referring to FIG. 6, during periods T1 to T3 during a horizontal blanking period (H•BLK), the signal of the pixel a is read. First, during the period T1, signals φVL and φM1 are set to a high level to turn on the transistors M3 and M1 and remove residual charges on the vertical output line VL1.

Next, during the period T2, signals φGCK, φSO, φHCL, φT1 and φM1 are set to the high level, so that the reset means MRES of the pixel a is turned on and the common amplifier is reset, and that the select means MSEL and transistor M1 are turned on to read the noise of the common amplifier and transfer the noise to the input electrode of the capacitor Cp while the output electrode of the capacitor Cp is maintained at a constant potential. At this time, the capacitor Ca is also reset to a constant potential. Thereafter, during the period between the periods T2 and T3, φHCL is set to a low level so that the output electrode of the capacitor Cp is made in a floating state.

Next, during the period T3, signals φGT, φSO, φT1 and φM1 are set to the high level, so that the transfer means MTX is turned on to transfer the signal in the photoelectric conversion portion of the pixel a to the input portion (gate) of the common amplifier, and that the select means MSEL and transistors M1 and M5 are turned on to read the photoelectric conversion signal, transfer it to the input electrode of the capacitor Cp, and store the noise removed photoelectric conversion signal in the capacitor Ca. The noise elimination operation is performed in the manner described earlier.

During periods T4 to T6, the signal of the pixel b is read in the manner similar to the signal read of the pixel a. The photoelectric conversion signals of the pixels a and b stored in the capacitors Ca and Cb are sequentially read by the horizontal shift resister (H•SR). In this embodiment, the capacitors Ca and Cb are provided at the output side of the capacitor Cp to temporarily store the signals of the pixels a and b. The capacitors Ca and Cb may be omitted to sequentially output the signals from the pixels to the horizontal output line without temporarily storing the signals.

Figure 3:
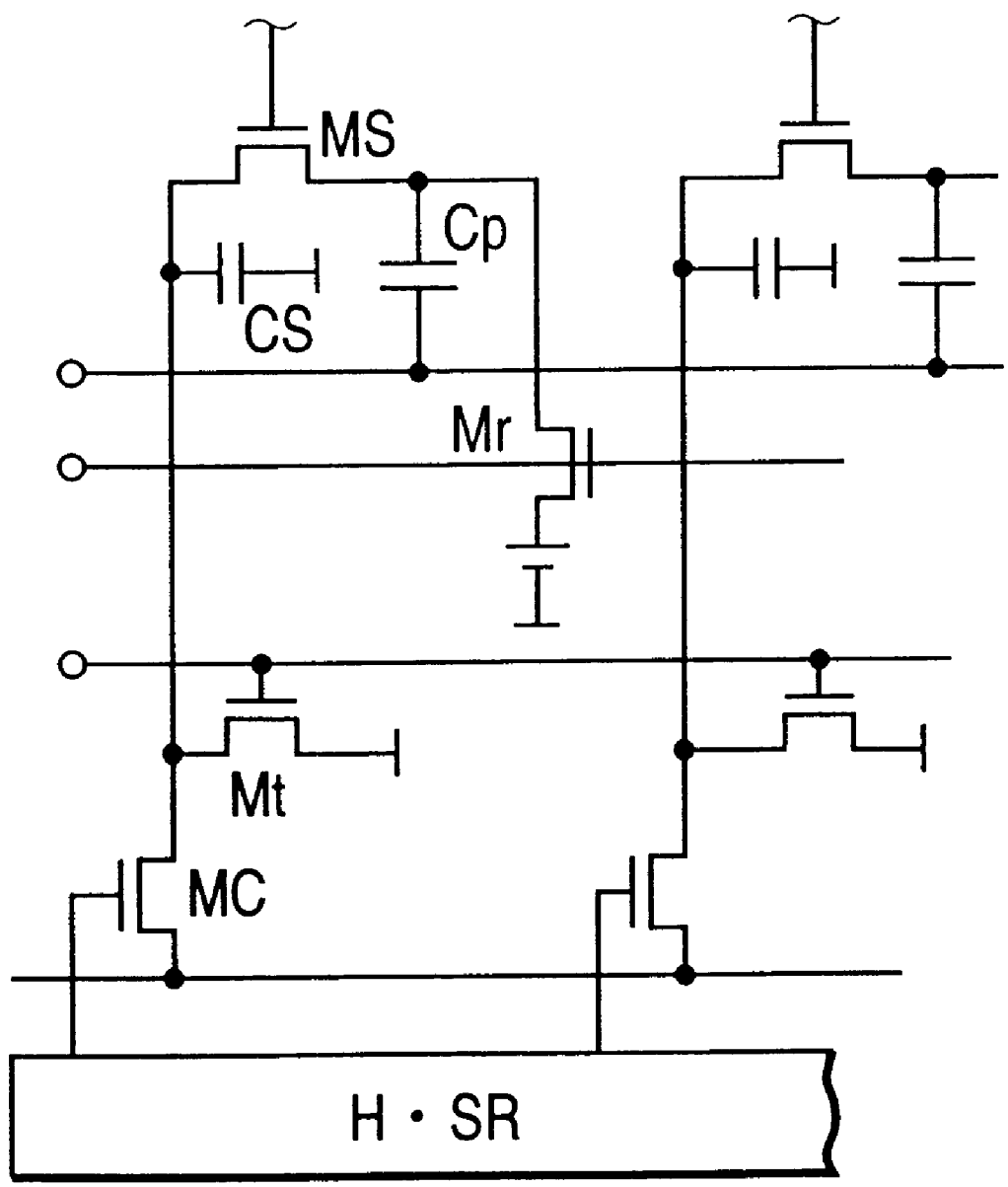
FIG. 3 is a schematic circuit diagram showing another example of a noise eliminating circuit of a conventional image pickup apparatus.
Figure 7:
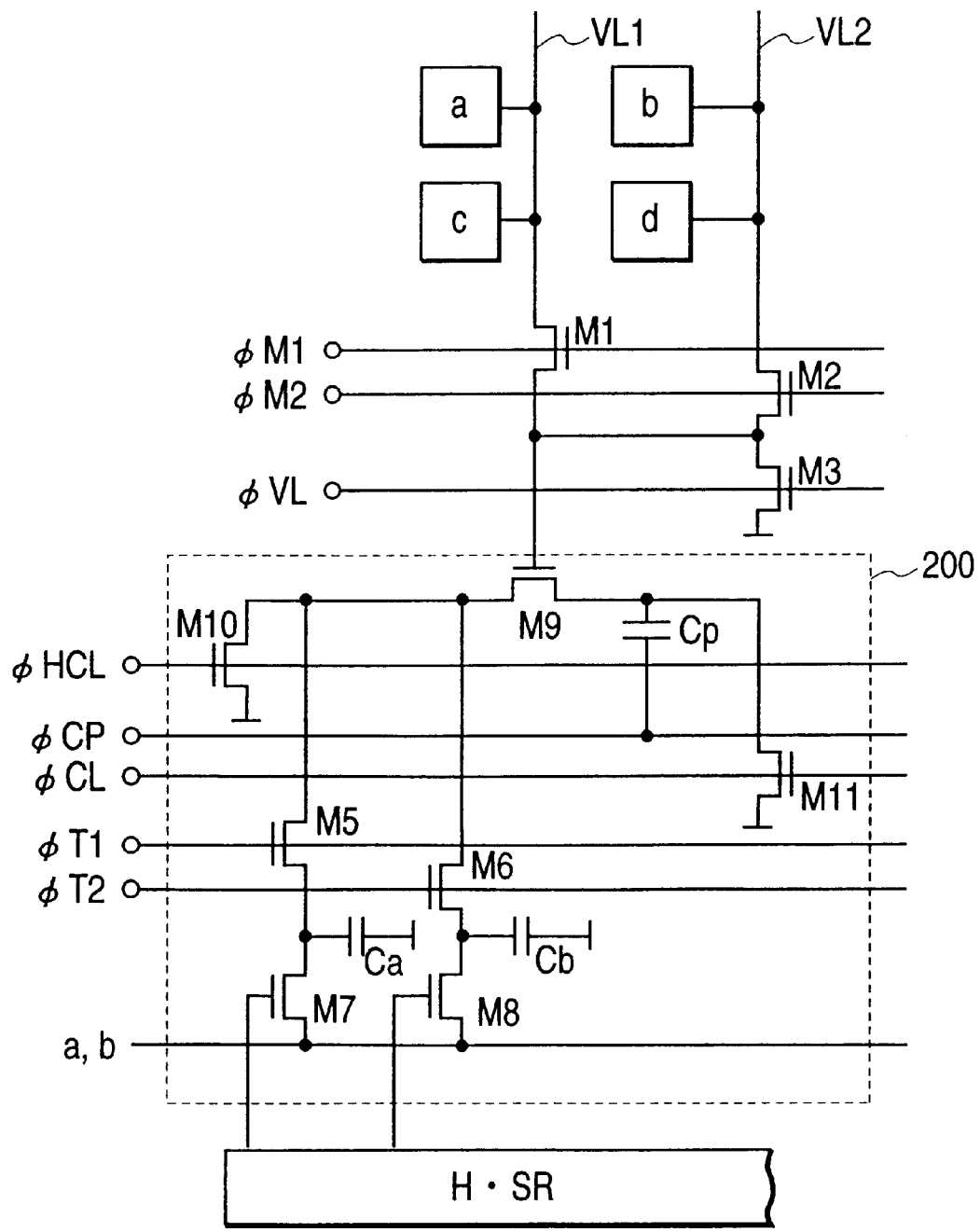
FIG. 7 is a schematic circuit diagram showing the structure of an image pickup apparatus according to a second embodiment of the invention.

FIG. 7 is a schematic circuit diagram showing the structure of an image pickup apparatus according to the second embodiment of the invention. In this embodiment, the noise eliminating circuit is different from the structure shown in FIG. 4. The fundamental structure of the noise eliminating circuit is the same as that shown in FIG. 3. Reference numeral 200 represents a noise elimination/signal storage unit.

As shown in FIG. 7, vertical output lines VL1 and VL2 are connected to the gate of a common transistor M9 via transistors M1 and M2. The drain of the common transistor M9 is connected to a capacitor Cp and a transistor M11, and the source thereof is connected to a transistor M10 and via transistors M5 and M6 to capacitors Ca and Cb.

In order to remove the noise, transistors M11, M10 and M5 are turned on and reset, and thereafter during a noise output period of the pixel a, a negative pulse is applied to the capacitor Cp to transfer the charges over the channel potential φn of the transistor M9 to the capacitor Ca, which charges are drained by turning on the transistor M10. Again during the signal output period of the pixel a, a negative pulse is applied to the capacitor Cp to transfer the charges over the channel potential φs of the transistor M9 to the capacitor Ca. The charges transferred to the capacitor Ca are Cp×(φs−φn) which correspond to the noise removed signal. In the similar manner, the noise removed signal of the pixel b is stored in the capacitor Cb. Thereafter, similar to the first embodiment, the noise removed signal of the pixel a and the noise removed signal of the pixel b are sequentially output to the horizontal output line.

Also in this embodiment, since the noise eliminating capacitor Cp is shared by the two vertical output lines, only three capacitors are used for two vertical output lines.

Figure 8:
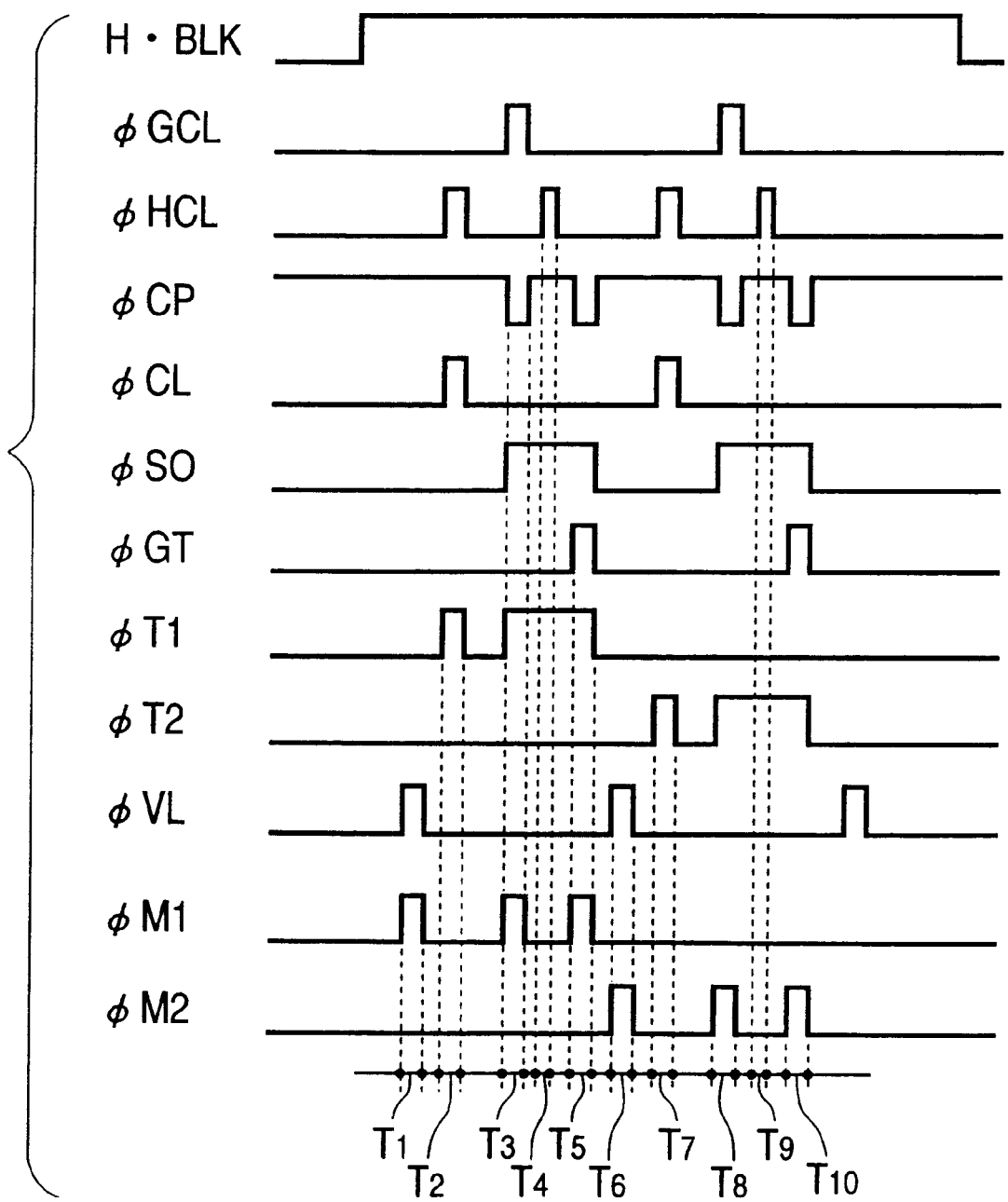
FIG. 8 is a timing chart illustrating the operation of the image pickup apparatus shown in FIG. 7.

FIG. 8 is a timing chart illustrating the operation of the image pickup apparatus.

Referring to FIG. 8, during periods T1 to T5 during the horizontal blanking period (H•BLK), the signal of the pixel a is read. First, during the period T1, the signals φVL and φM1 are set to the high level to turn on the transistors M3 and M1 and remove residual charges on the vertical output line VL1.

Next, during the period T2, signals φHCL, φCL and φT1 are set to the high level to turn on the transistors M10, M11 and M5 and reset the residual charges.

Next, during the period T3, signals φHCL, φSO and φM1 are set to the high level, so that the reset means MRES of the pixel a is turned on and the common amplifier is reset, and that the select means MSEL and transistor M1 are turned on to read the noise of the common amplifier and transfer the noise to the gate of the transistor M9. At the same time, the signal φT1 is set to the high level, the signal φCP is set to the low level, and a negative pulse is applied to the capacitor Cp to transfer charges over the channel potential φn of the transistor M9 to the capacitor Ca.

Next, during the period T4, signals φHCL and φT1 are set to the high level to turn on the transistors M10, M11 and M5 and drain the charge in the capacitor Ca.

Next, during the period T5, signals φHCL, φSO and φM1 are set to the high level, so that the transfer means MTX is turned on to transfer the signal of the photoelectric conversion portion of the pixel a to the input portion (gate) of the common amplifier, and that the select means MSEL and transistor M1 are turned on to read the photoelectric conversion signal and transfer it to the gate of the transistor M9. At the same time, the signal φT1 is set to the high level, the signal φCP is set to the low level, and a negative pulse is again applied to the capacitor Cp to transfer charges over the channel potential φs of the transistor M9 to the capacitor Ca. The charges transferred to the capacitor Ca correspond to Cp×(φs−φn) so that the noise removed signal is stored in the capacitor Ca.

During periods T6 to T10, the signal of the pixel b is read in the manner similar to the signal read of the pixel a. The photoelectric conversion signals of the pixels a and b stored in the capacitors Ca and Cb are sequentially read by the horizontal shift resister (H•SR).

Figure 9:
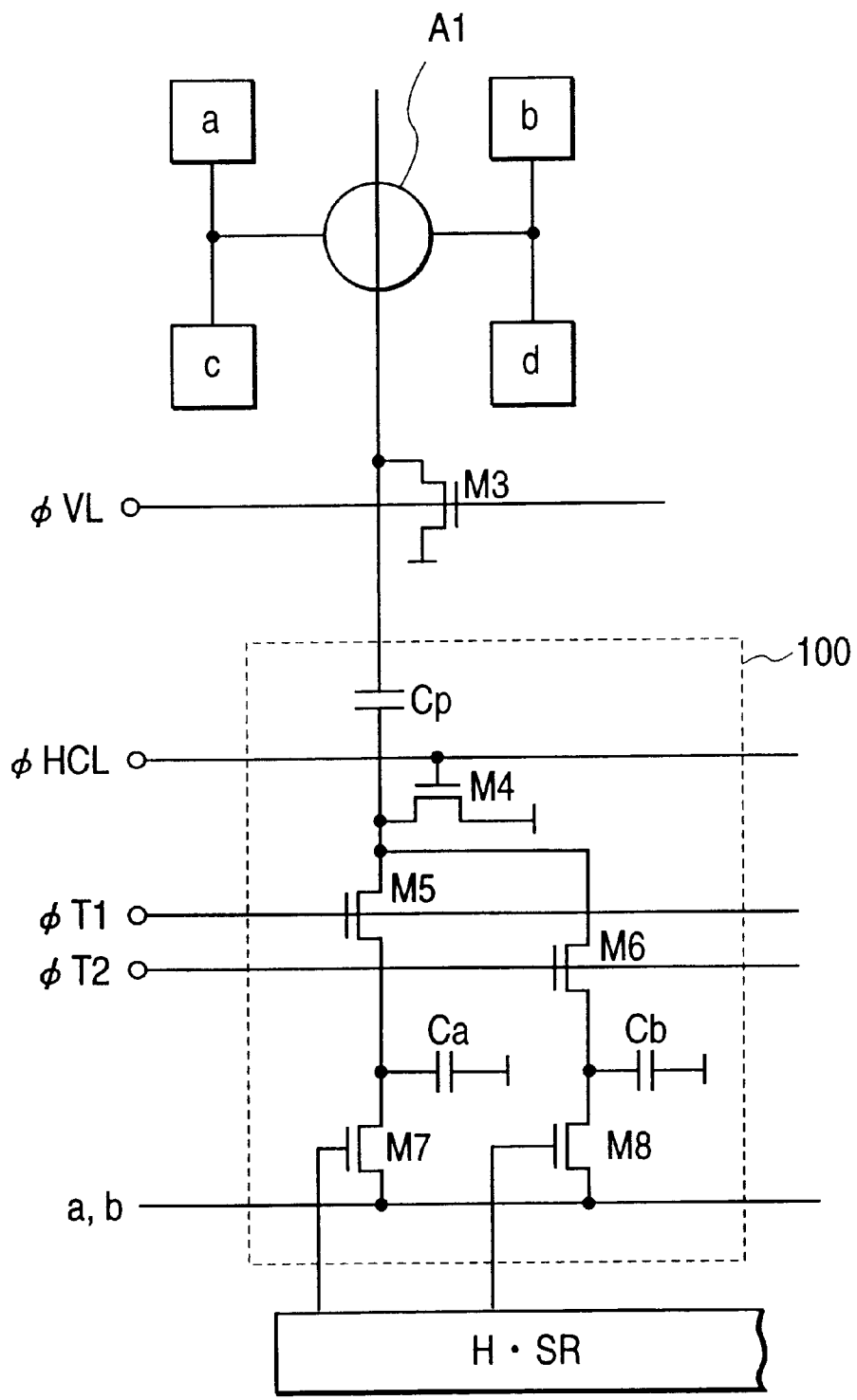
FIG. 9 is a schematic circuit diagram showing the structure of an image pickup apparatus according to a third embodiment of the invention.

FIG. 9 is a schematic circuit diagram showing the structure of an image pickup apparatus according to the third embodiment of the invention. In this embodiment, the structure of the photoelectric conversion pixel is different from that shown in FIG. 4. The structure of the noise elimination/signal storage unit is the same as the noise elimination/signal storage unit 100 shown in FIG. 4. In FIG. 9, like elements to those shown in FIG. 4 are represented by using identical alphanumeric symbols and the description thereof is omitted.

In this embodiment, signals from four photoelectric conversion portions are output via one common amplifier. In other words, signals of two pixel lines (a pixel line of the photoelectric conversion portions a and c, and a pixel line of the photoelectric conversion portions b and d) can be output from one vertical output line. In FIGS. 9, a, b, c and d represent the photoelectric conversion portions, and A1 represents the common amplifier. A unit cell is constituted of the photoelectric conversion portions (e.g., photodiodes) a, b, c and d and the common amplifier A1, and each pixel is constituted by one photoelectric conversion portion and a portion of the common amplifier.

Figure 10:
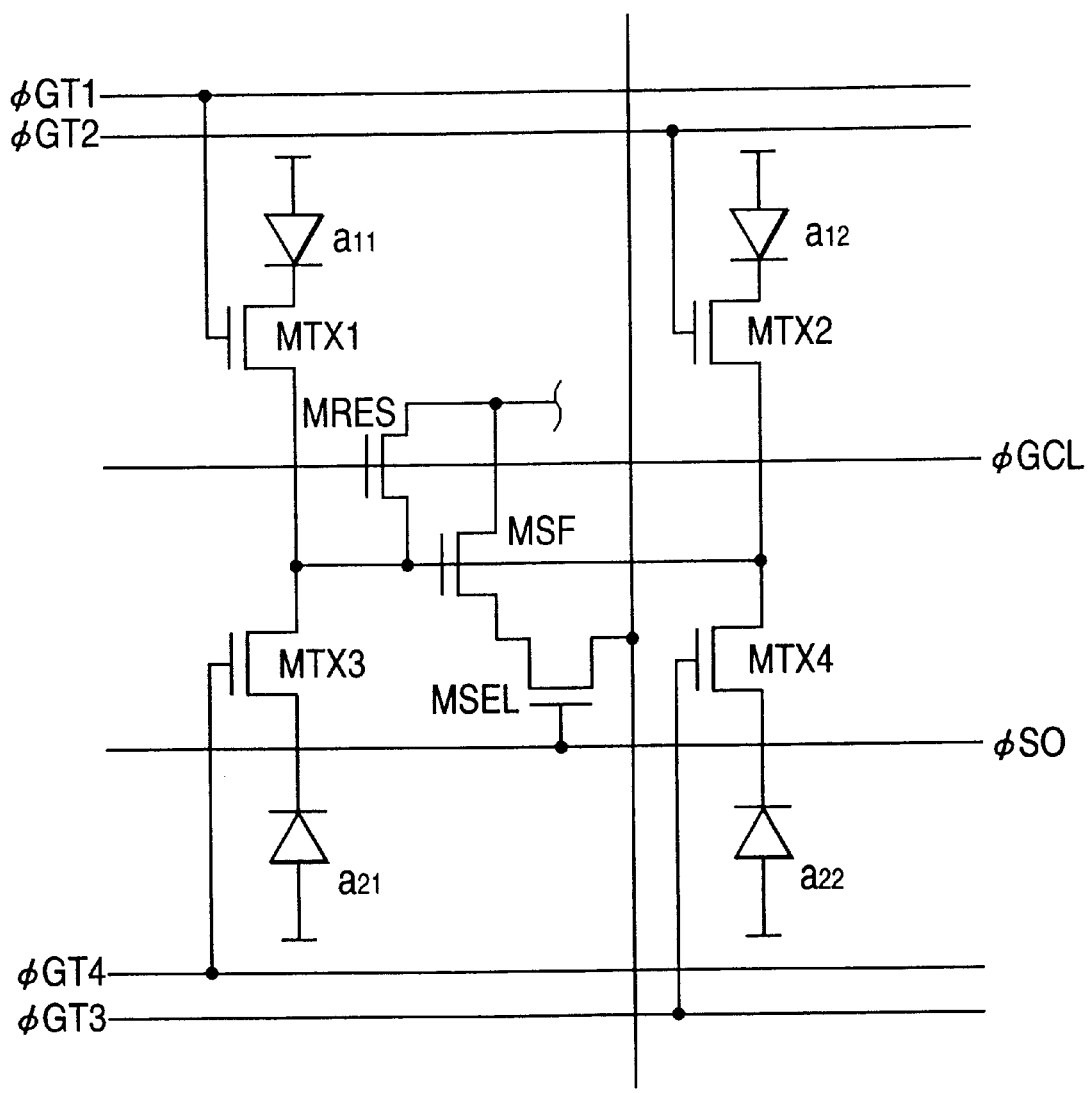
FIG. 10 is a diagram showing the structure of a unit cell.

FIG. 10 shows the structure of a unit cell. As shown in FIG. 10, the unit cell has four photoelectric conversion portions (in this case, a11, a12, a21, a22) per one common amplifier. The other unit cells have the same structure. The common amplifier is constituted of an amplification means MSF, a reset means MRES, a select means MSEL and transfer means MTX1 to MTX4. The transfer means MTX1 to MTX4 are sequentially turned on by control signals φGT1 to φGT4 to sequentially transfer signals of the photoelectric conversion portions a11, a12, a21 and a22 to the input portion (gate) of the amplification means MSF. When the select means MSEL is turned on by a select signal φSO, a signal corresponding to the signal charges transferred to the gate of the amplification means MSF is read to the vertical output line. Before the signal of the photoelectric conversion portion is transferred to the input portion (gate) of the amplification means MSF, the reset means MRES is turned on by the reset signal φGCL so that the input portion of the amplification means MSF is reset and the noise is output via the select means MSEL to the vertical output line.

Figure 11:
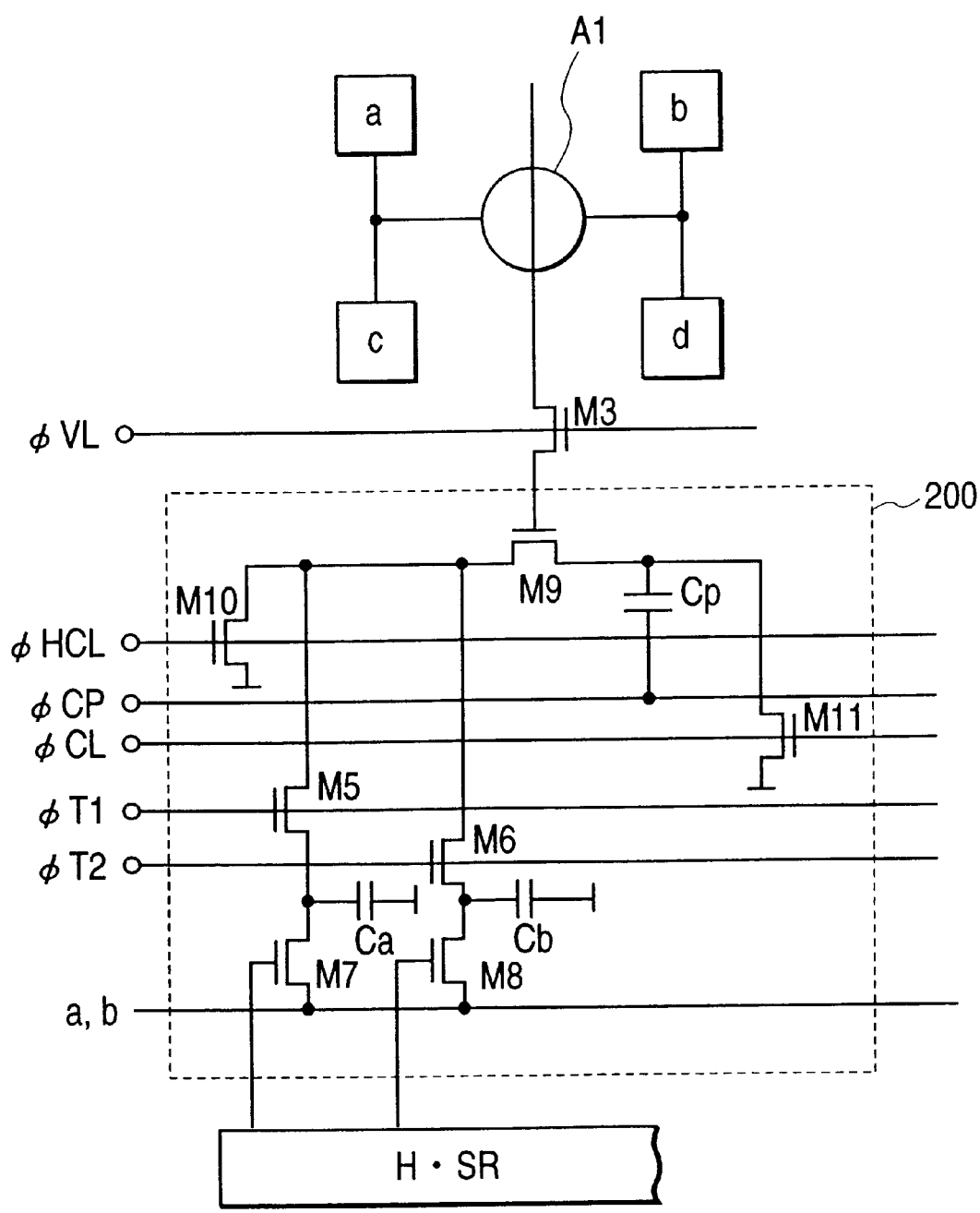
FIG. 11 is a schematic circuit diagram showing the structure of an image pickup apparatus according to a fourth embodiment of the invention.

FIG. 11 is a schematic circuit diagram showing the structure of an image pickup apparatus according to the fourth embodiment of the invention. In this embodiment, the structure of the photoelectric conversion pixel is the same as that shown in FIG. 9, and the structure of the noise elimination/signal storage unit is the same as the noise elimination/signal storage unit 200 shown in FIG. 7. In FIG. 11, like elements to those shown in FIGS. 7 and 9 are represented by using identical alphanumeric symbols and the description thereof is omitted.

Figure 12:
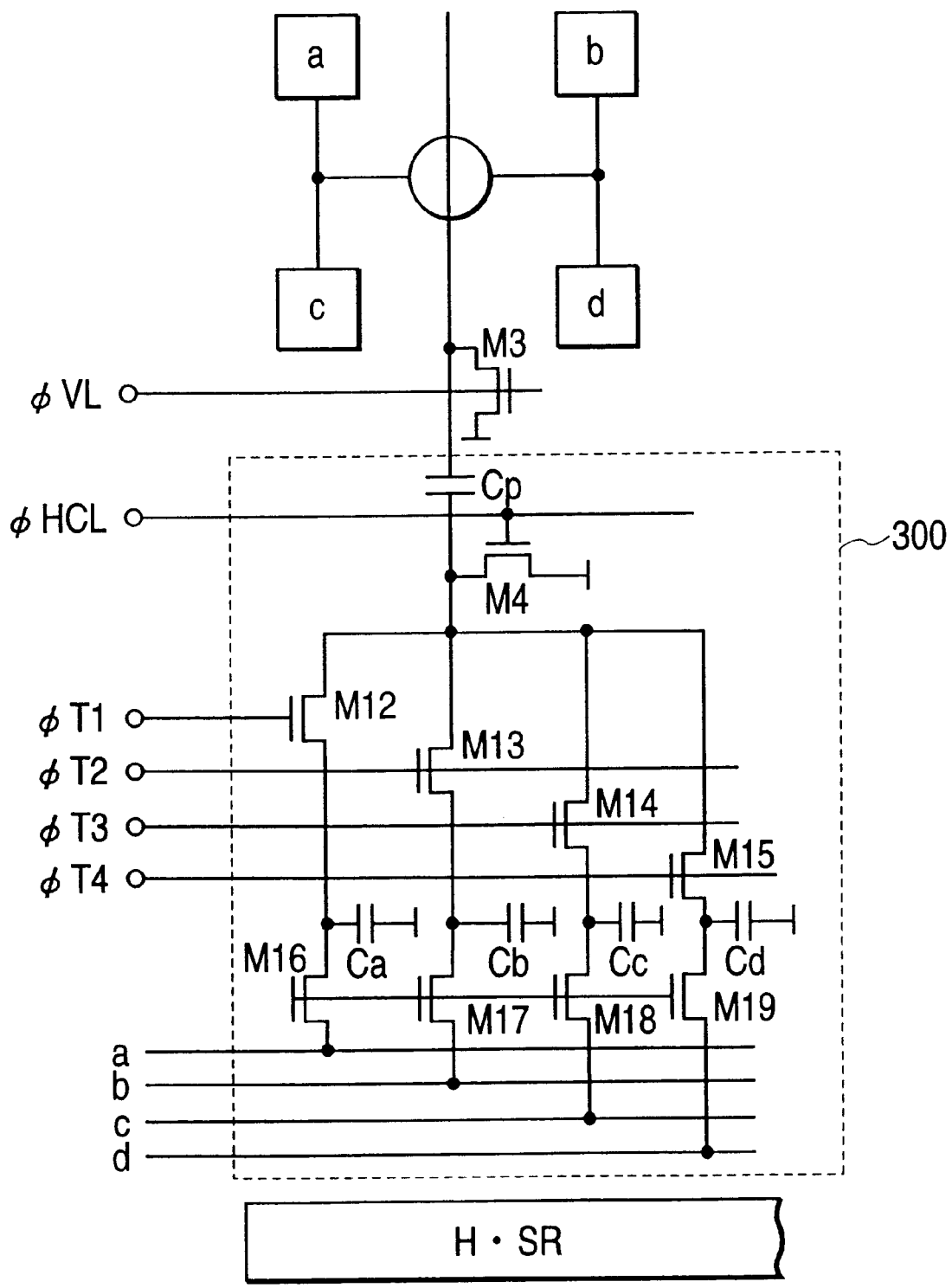
FIG. 12 is a schematic circuit diagram showing the structure of an image pickup apparatus according to a fifth embodiment of the invention.

FIG. 12 is a schematic circuit diagram showing the structure of an image pickup apparatus according to the fifth embodiment of the invention. In this embodiment, although the fundamental structure is the same as that shown in FIG. 9, a different point is the provision of signal charge capacitors Ca to Cd for the photoelectric conversion portions a to d, transistors M12 to M15, and transistors M16 to M19. If a capacitor is provided for each of the photoelectric conversion portions a to d, four noise elimination capacitors Cp and four signal storage capacitors C, eight capacitors in total, are required. In this embodiment, it is sufficient if one noise elimination capacitor Cp and four signal storage capacitors C (Ca to Cd), five capacitors in total, are provided.

Figure 13:
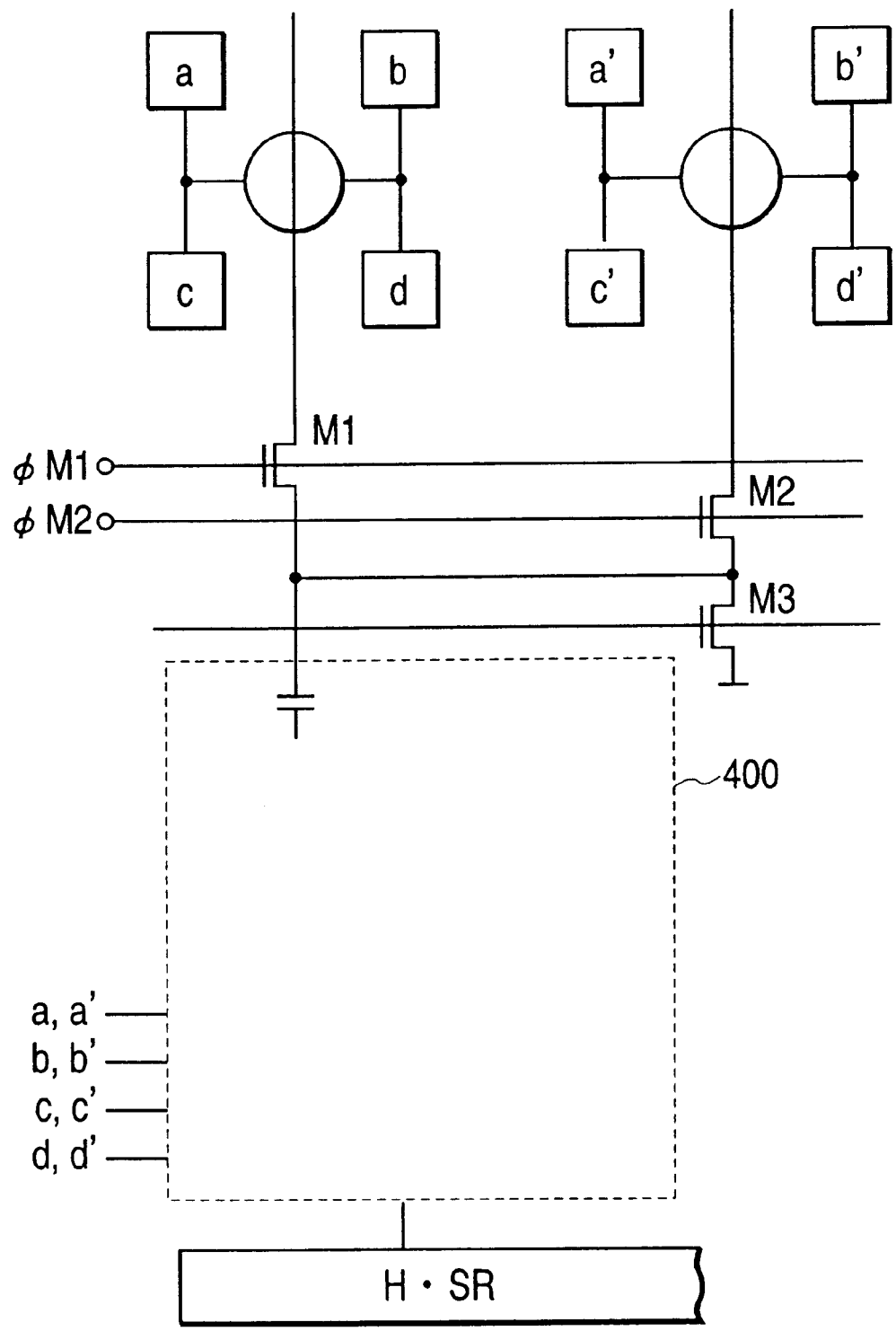
FIG. 13 is a schematic circuit diagram showing the structure of an image pickup apparatus according to a sixth embodiment of the invention.

FIG. 13 is a schematic circuit diagram showing the structure of an image pickup apparatus according to the sixth embodiment of the invention. In this embodiment, although the fundamental structure of the noise elimination/signal storage unit 400 is the same as the noise elimination/signal storage unit 300 shown in FIG. 12, a different point is the provision of signal storage capacitors and transistors for photoelectric conversion portions a' to d' in addition to the photoelectric conversion portions a to d. The noise elimination capacitor Cp is used in common.

In this embodiment, the noises and signals of a unit cell line having the photoelectric conversion portions a' to d' in addition to a unit cell line having the photoelectric conversion portions a to d are input to the noise elimination/signal storage unit 300.

If a capacitor is provided for each of the photoelectric conversion portions a to d and a' to d', eight noise elimination capacitors Cp and eight noise removed signal storage capacitors C, sixteen capacitors in total, are required. In this embodiment, it is sufficient if one noise elimination capacitor Cp and eight noise reduced signal storage capacitors C, nine capacitors in total, are provided.

Figure 14:
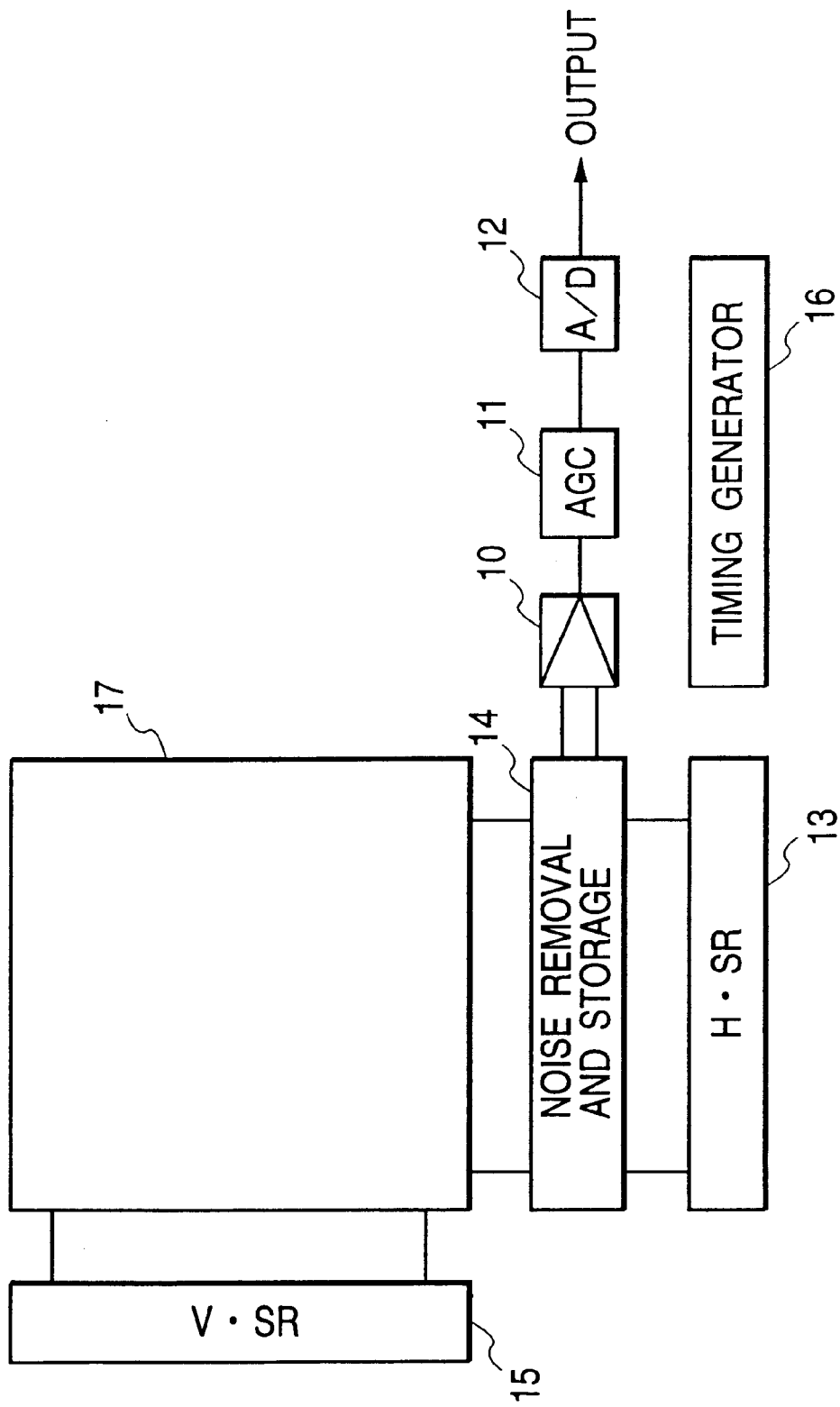
FIG. 14 is a diagram showing the overall structure of the image pickup apparatus.

FIG. 14 is a block diagram showing the overall structure of the image pickup apparats.

Reset, noise/signal read, and photoelectric conversion control for each photoelectric conversion cell is performed by a vertical shift register (V•SR) 15. Control of the noise elimination/signal storage unit 14 such as shown at 100, 200 and 300 in the above embodiments is performed by a horizontal shift register (H•SR) 13. A signal is amplified by an amplifier 10 and converted into a digital signal via an AGC circuit 11 and an A/D converter 12. A timing generator 16 is used for controlling the operation of the vertical shift register (V.SR) 15, horizontal shift register (H•SR) 13, amplifier 10, AGC circuit 11 and A/D converter 12. Reference numeral 17 represents an image pickup element array having photoelectric conversion cells disposed in a matrix shape.

In the embodiments shown in FIGS. 6, 8 to 10, a divisional read and output method of signals from a unit sell constituted of four pixels of two lines has been described. The unit cell may be constituted of any plurality of pixels of any plurality of lines.

As described above, in the first to sixth embodiments, subtracting means is shared so that the number of signal storage means for storing subtraction outputs from the subtracting means can be reduced.

Accordingly, a sensor chip size, cost as well as consumption power can be reduced.

Even if an image pickup apparatus has no signal storage means, the number of subtraction means can be reduced. Therefore, a sensor chip size, cost as well as consumption power can be reduced more than conventional.

As the related art of the first to sixth embodiments, JP-A-4-281683 discloses that outputs of odd and even line pixels connected to one vertical output line are supplied to a common noise elimination circuit (CDS circuit: correlation double sampling circuit), and after noises are removed, the signals from two pixels are stored in two capacitors. According to this related art, the noise elimination circuit is shared by a plurality of pixels connected to one vertical output line. In contrast, according to the first to sixth embodiments, a common subtracting means (corresponding to the noise elimination circuit) is used by the image pickup apparatus having a plurality lines of unit cells each constituted of a plurality of photoelectric conversion portions and a common amplifier, and also the common subtracting means is shared by a plurality of output lines. Therefore, this prior art has different technical concept from the present invention.

Figure 15:
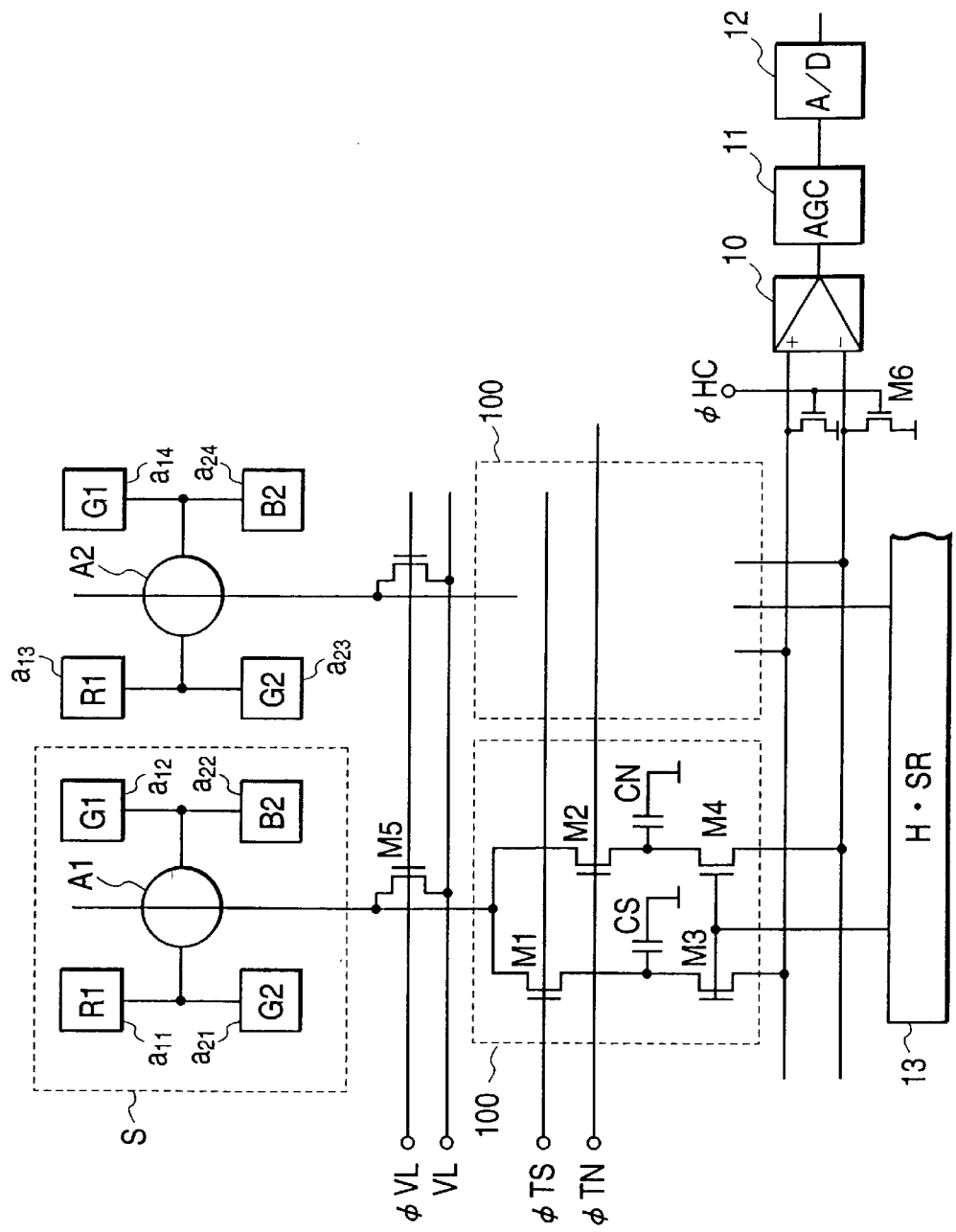
FIG. 15 is a schematic circuit diagram showing the structure of an image pickup apparatus according to a seventh embodiment of the invention.

FIG. 15 is a schematic circuit diagram showing the structure of an image pickup apparatus according to the seventh embodiment of the invention. In this embodiment, a photoelectric conversion cell (unit cell) is constituted of four photoelectric conversion portions and one common amplifier. For example, the photoelectric conversion portions a11, a12, a21 and a22 have color filters R1 (red), G1 (green), G2 (green) and B2 (blue), respectively. R1, G1, G2 and B2 signals of the photoelectric conversion portions are output via the common amplifier A1 to the vertical output line. The noise signal after resetting is also output via the common amplifier A1 to the vertical output line.

Reference numeral 100 represents a signal storage unit constituted of a signal storage capacitor CS, a noise storage capacitor CN, capacitor switching transistors M1 and M2 and signal output transistors M3 and M4. The signal storage capacitor CS and noise storage capacitor CN are connected in parallel via the transistors M1 and M2 to one vertical output line. The signal stored in the capacitor CS and the noise stored in the capacitor CN are read to respective horizontal output lines when the transistors M3 and M4 are turned on at the same time by the horizontal shift register (H·SR), and supplied to a subtracting amplifier 10 which subtracts the noise from the signal. The noise removed signal is converted into a digital signal via an AGC circuit 11 and an A/D converter 12. The horizontal output lines are reset by a transistor M6 which is controlled by φHC.

In this embodiment, two capacitors are provided for each vertical output line. However, since signals of the two lines of photoelectric conversion portions are output from the common amplifier to one vertical output line, only one capacitor is connected for each line of photoelectric conversion portions.

FIG. 10 shows the structure of a photoelectric conversion cell S. As shown in FIG. 10, the photoelectric conversion cell S has four photoelectric conversion portions (in this case, a11, a12, a21, a22) per one common amplifier. The other photoelectric conversion cells have the same structure. The common amplifier is constituted of an amplification means MSF, a reset means MRES, a select means MSEL and transfer means MTX1 to MTX4. The transfer means MTX1 to MTX4 are sequentially turned on by control signals φGT1 to φGT4 to sequentially transfer signals of the photoelectric conversion portions a11, a12, a21 and a22 to the input portion (gate) of the amplification means MSF. When the select means MSEL is turned on by a select signal φSO, a signal corresponding to the signal charges transferred to the gate of the amplification means MSF is read to the vertical output line. Before the signal of the photoelectric conversion portion is transferred to the input portion (gate) of the amplification means MSF, the reset means MRES is turned on by the reset signal φGCL so that the input portion of the amplification means MSF is reset and the noise is output via the select means MSEL to the vertical output line.

Figure 16:
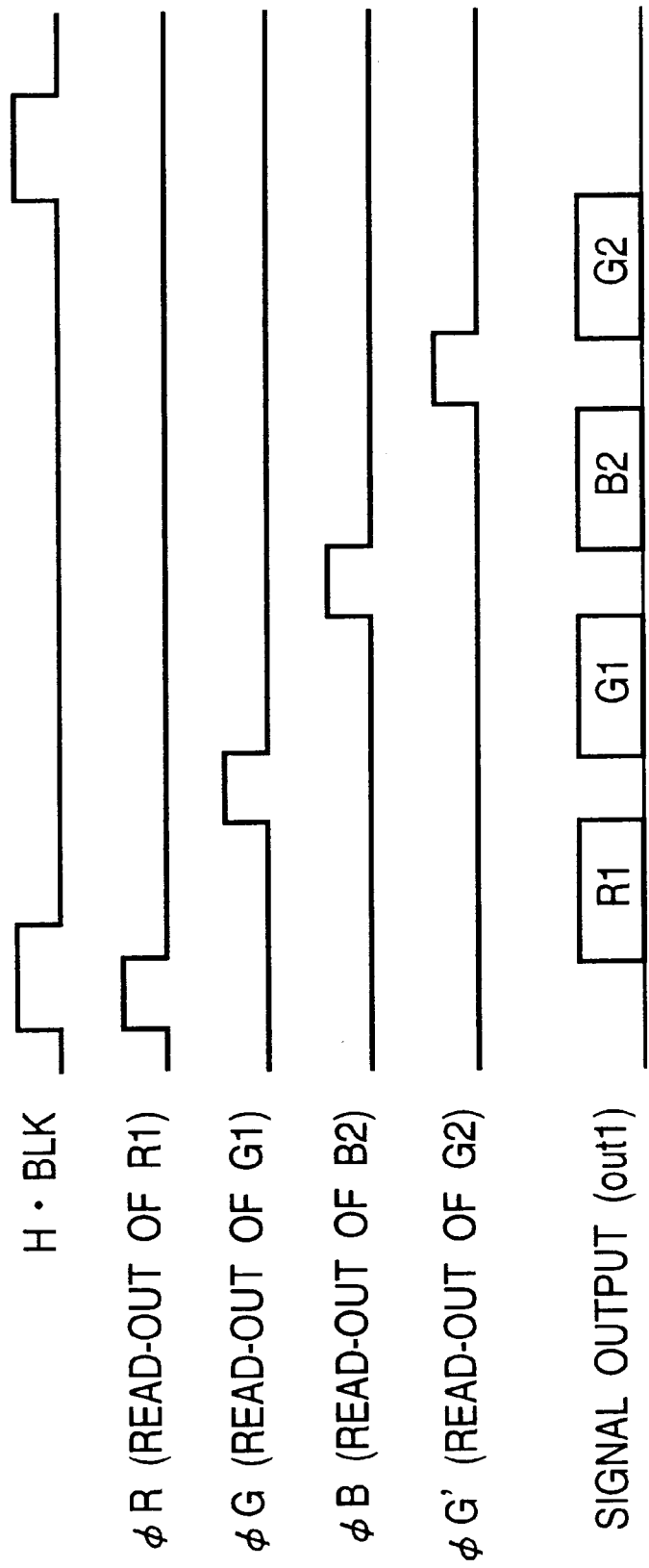
FIG. 16 is a timing chart illustrating the operation of the image pickup apparatus shown in FIG. 15.

FIG. 16 is a timing chart illustrating the operation of the image pickup apparatus shown in FIG. 15. During one horizontal scan period, each color signal is sequentially and time divisionally read (R1 read (φR period)→G1 read (φG period)→B2 read (φB period)→G2 read (φG' period)). After the color signals are read, the signal and noise are output from the temporary storage capacitors CS and CN. The subtraction amplifier 10 subtracts the noise from the signal, and the noise removed signal is converted into a digital signal via the AGC circuit 11 and A/D converter 12 to thus output R1, G1, B1 and G2 digital color signals (signal out 1).

In this embodiment, an output signal is a line sequential color signal. The digital signals after A/D conversion are temporarily stored in a later stage storage unit and subjected to image processing. A noise elimination method is not limited to the embodiment method, but other methods can be applied such as a slice type illustrated in FIG. 3.

Figure 17:
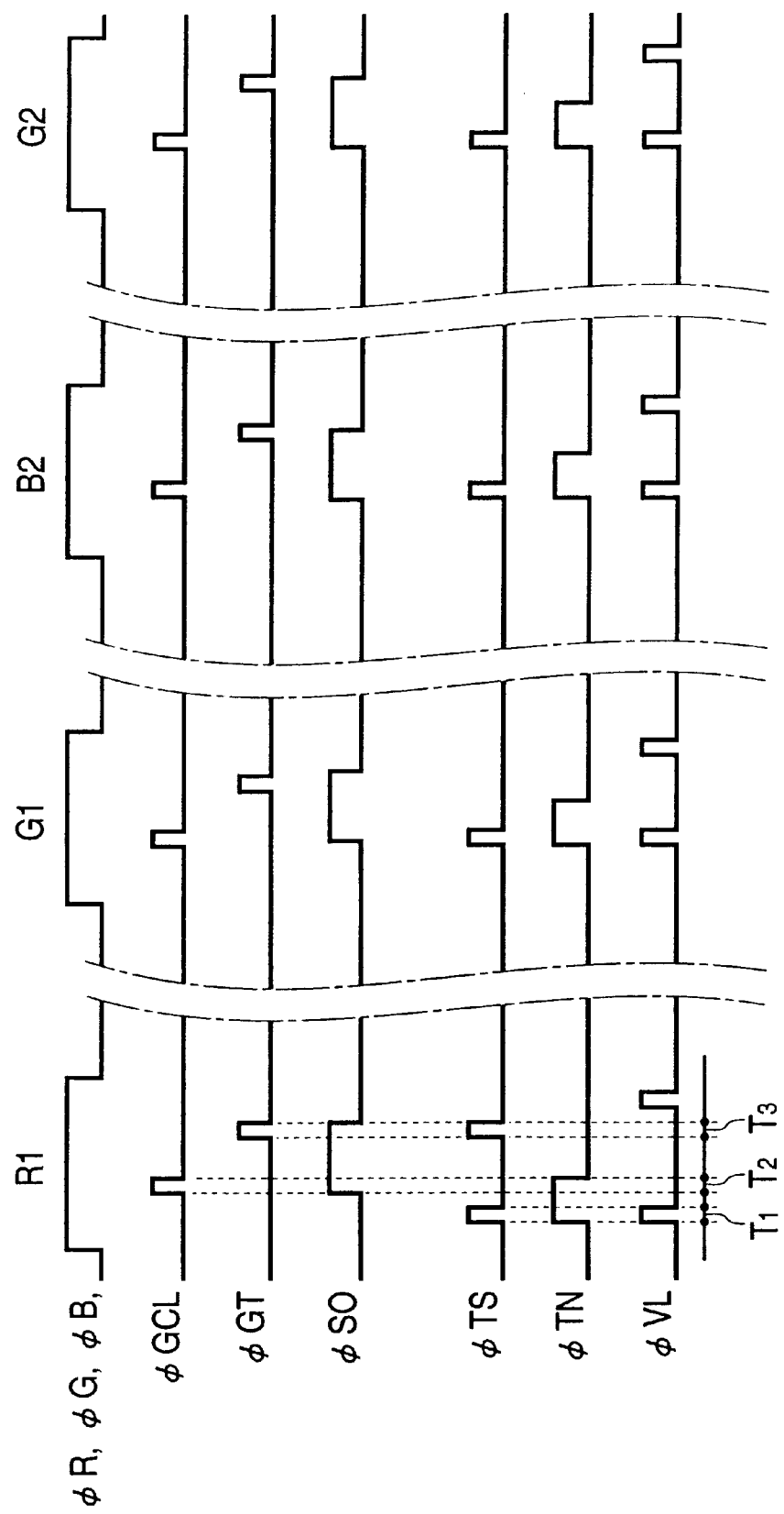
FIG. 17 is a timing chart illustrating the operation during each color signal read period.

FIG. 17 is a timing chart illustrating the operation of the image pickup apparatus during a color signal read period.

During a period T1 in the R1 read period shown in FIG. 17, signals φTS, φTN and φVL are set to the high level to turn on the transistors M1, M2 and M5 and drain residual charges on the vertical output line and in the temporary storage capacitors CS and CN.

Next, during a period T2, signals φGCL, φSO and φTN are set to the high level so that the reset means MRES is turned on to reset the common amplifier and the select means MSEL and transistor M2 are turned on to read the noise from the common amplifier and store it in the temporary storage capacitor CN.

Next, during a period T3, signals φGT, φSO and φTS are set to the high level so that the transfer means MTX1 is turned on to transfer the signal from the photoelectric conversion portion to the input portion (gate) of the common amplifier and the select means MSEL and transistor M1 are turned on to read the signal from the common amplifier and store it in the temporary storage capacitor CS. Similar operations are performed also for the G1, B2 and G2 read periods.

Figure 18:
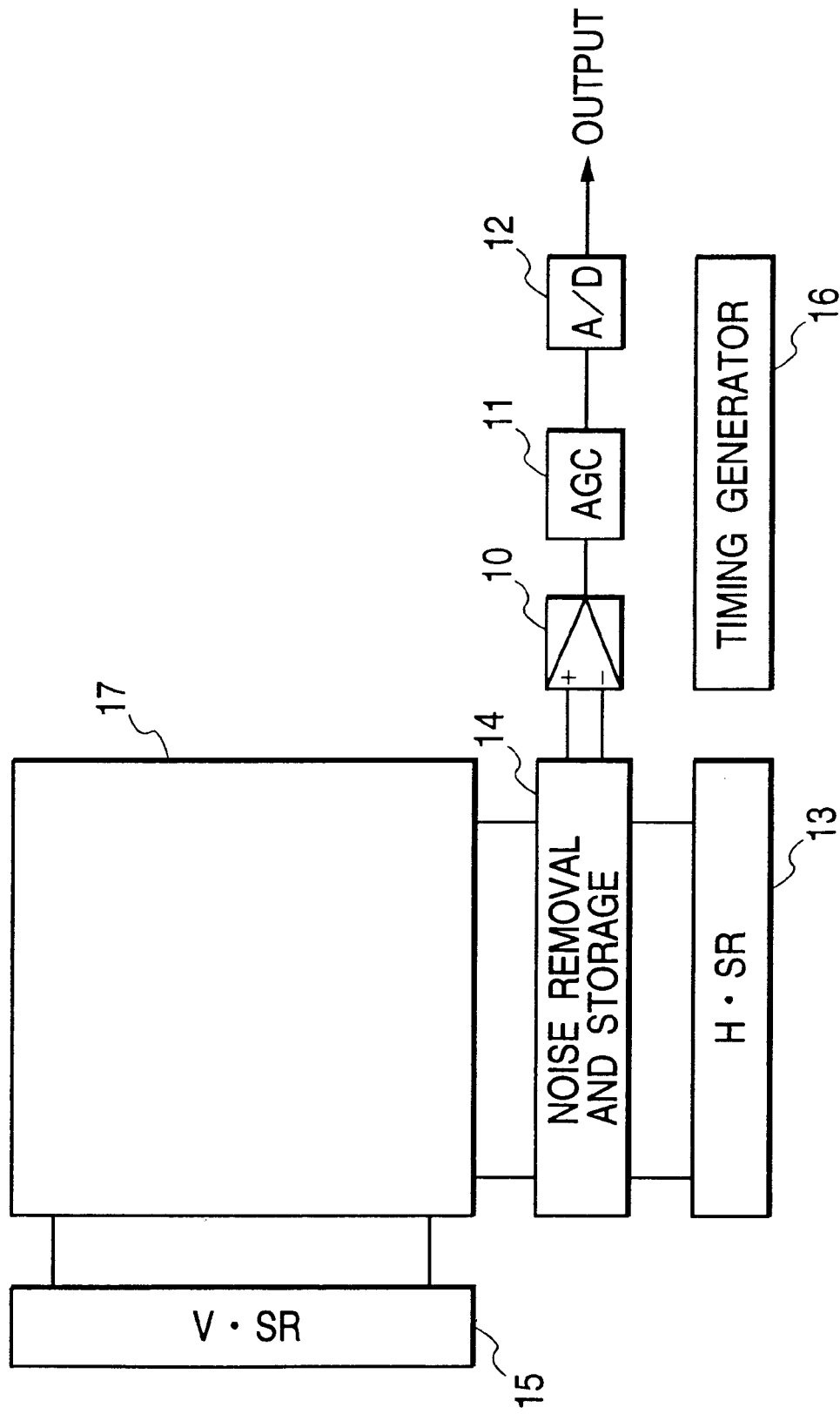
FIG. 18 is a diagram showing the overall structure of the image pickup apparatus shown in FIG. 15.

FIG. 18 is a block diagram showing the overall structure of the image pickup apparats.

Reset, noise/signal read, and photoelectric conversion control for each photoelectric conversion cell is performed by a vertical shift register (V·SR) 15. Control of the noise elimination/signal storage unit 14 such as shown at 100 in FIG. 15 is performed by a horizontal shift register (H·SR) 13. A subtraction amplifier 10 subtracts the noise from the signal, and the noise removed signal is converted into a digital signal via an AGC circuit 11 and an A/D converter 12. A timing generator 16 is used for controlling the operation of the vertical shift register (V·SR) 15, horizontal shift register (H·SR) 13, amplifier 10, AGC circuit 11 and A/D converter 12. Reference numeral 17 represents an image pickup element array having photoelectric conversion cells disposed in a matrix shape.

In the embodiment shown in FIG. 15, a divisional read and output method of signals from a unit sell constituted of four pixels of two lines has been described. The unit cell may be constituted of any plurality of pixels of any plurality of lines.

In the above embodiments, the common circuit A1, A2, . . . is an amplifier. The common circuit may be other signal processing circuits such as an A/D converter circuit and a compression circuit.

Figure 19:
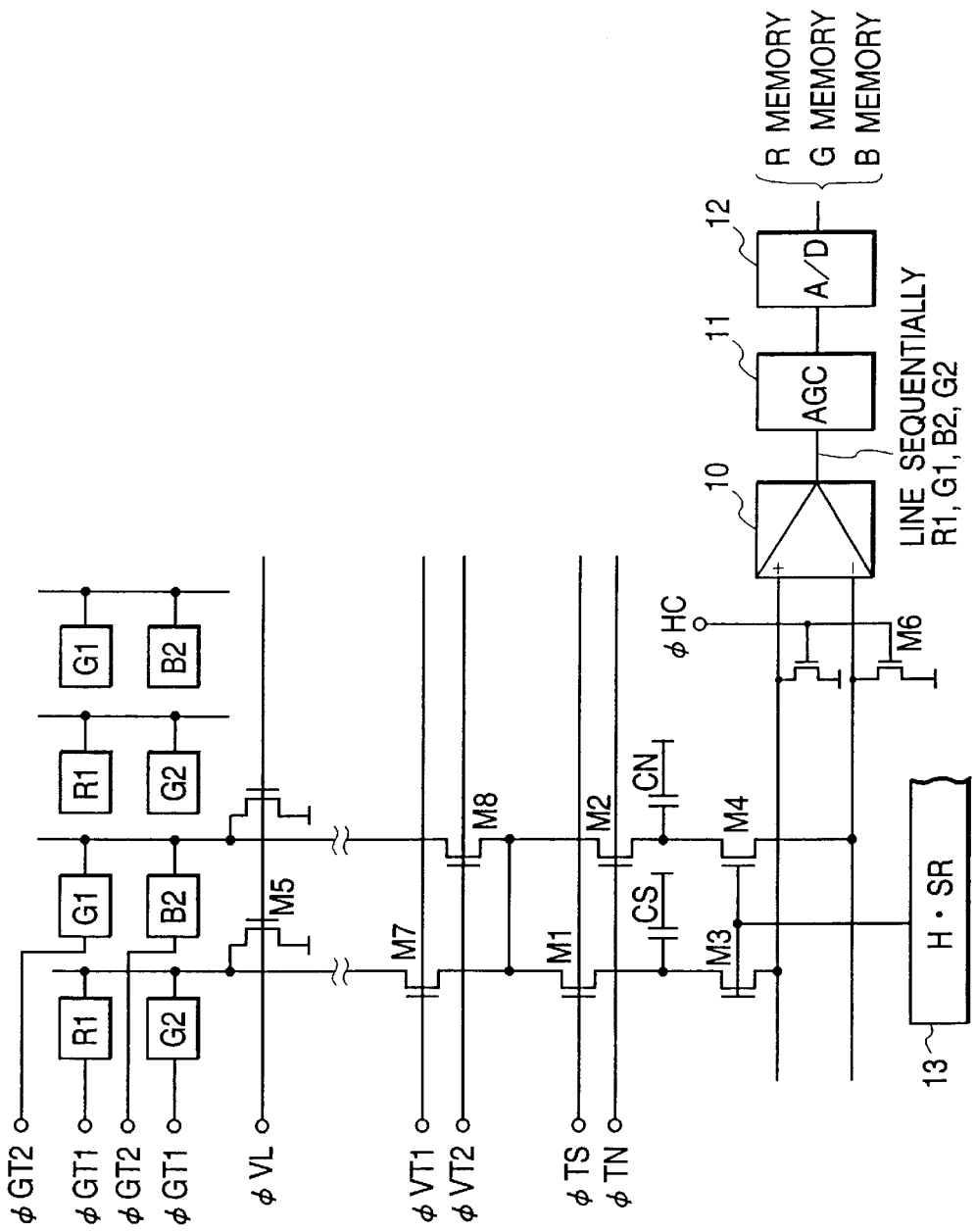
FIG. 19 is a schematic circuit diagram showing the structure of an image pickup apparatus according to an eighth embodiment of the invention.

FIG. 19 is a schematic circuit diagram showing the structure of an image pickup apparatus according to the eighth embodiment of the invention. The cell structure thereof is shown in FIG. 5.

In this embodiment, control lines are provided to each of odd and even lines to control the transfer means MTX by signals φGT1 and φGT2. Transistors M7 and M2 are turned on to store a noise read from a pixel R1 in a capacitor CN, and transistors M7 and M1 are turned on to store a signal read from the pixel R1 in a capacitor CS. The signal and noise are output from the capacitors CS and CN to horizontal output lines. Similarly, thereafter, noises and signals read from the other pixels G1, G2 and B2 are stored in the capacitors CN and CS and output to the horizontal signal lines.

If noises of an amplifier can be neglected or signal processing techniques become sophisticated, the noise storage capacitor is not necessary. In such a case, instead of discrete odd and even line control lines for the transfer means MTX, a common control line may be used. The image signal is transferred to the vertical output line in response to φGT and temporarily stored. Transfer of this signal to the signal storage capacitor CS is controlled by φVT1 and φVT2.

According to the seventh and eighth embodiments, it is possible to reduce the number of temporary storage capacitors. By reducing the number of stages of a shift register, common circuits, AGCs, and A/D converters, the chip size and cost can be reduced.

Furthermore, a low power consumption as the synergetic effect reduces noises of the fabricated image pickup apparatus. A divisional drive reduces the number of temporary storage units so that the number of transfer switches to be connected to a horizontal output line can also be reduced. Accordingly, a read gain from the temporary storage unit to the horizontal output line can be increased or conversely the capacity of a temporary storage unit can be reduced.

In the first to eighth embodiments described above, the noise components are subtracted from an image signal containing the noise components to obtain an image signal with a high S/N ratio. In some case, an image signal obtained through light signal accumulation under illumination light such as LED illumination may be subtracted by an image signal obtained through light signal accumulation without illumination light. In this case, an image made of only reflection light from LED subtracted by the noise components and background object components can be obtained.

Figure 20:
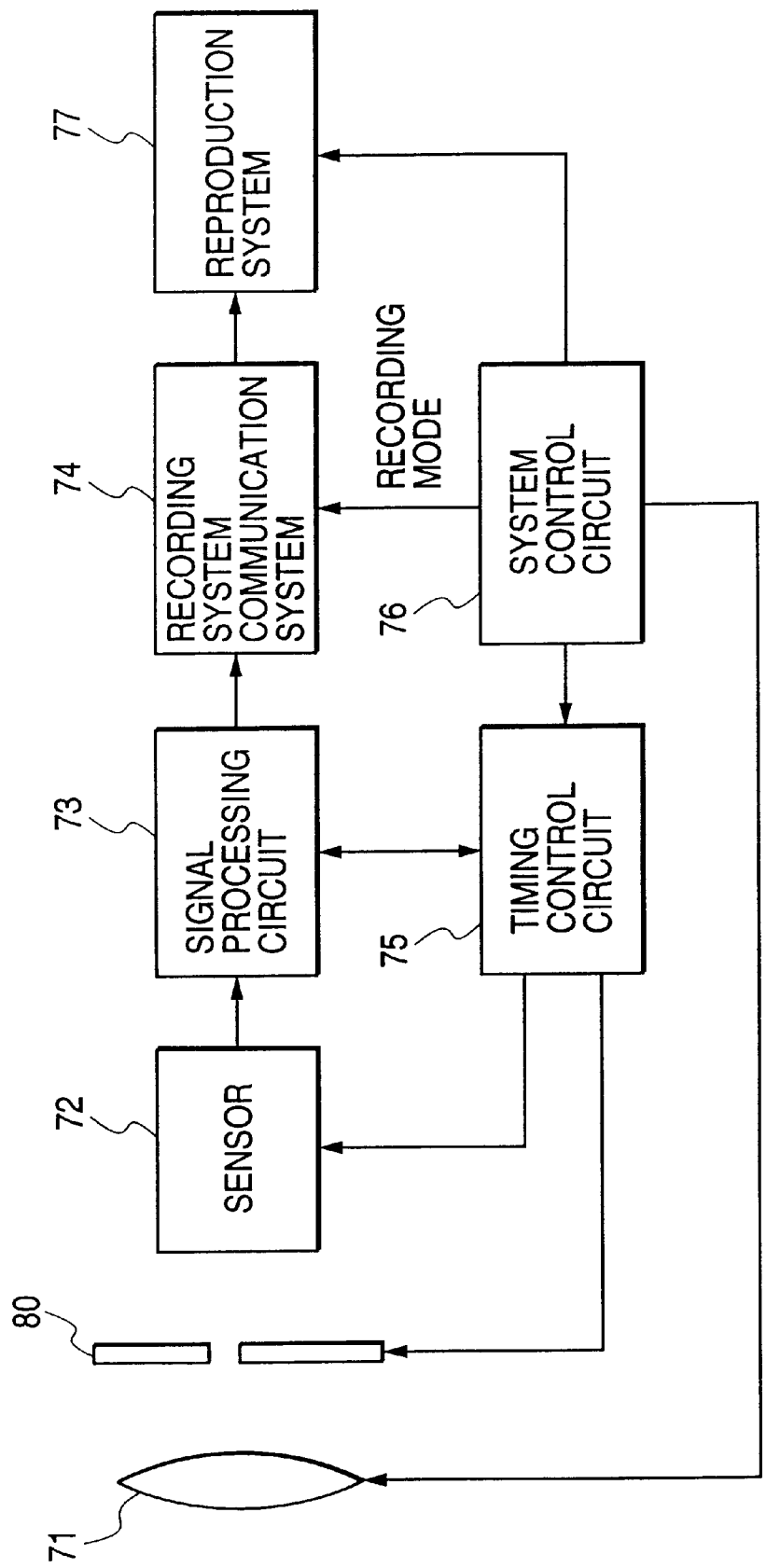
FIG. 20 is a schematic block diagram showing the outline of a system according to a ninth embodiment of the invention.

FIG. 20 is a schematic circuit diagram showing the structure of an image pickup apparatus according to the ninth embodiment of the invention. The ninth embodiment shown in FIG. 20 is an image pickup system using the image pickup apparatus of any one of the first to eighth embodiments described above. As shown in FIG. 20, light of an object passed through an optical system 71 and an iris 80 is focussed upon a CMOS sensor 72. Light is converted by a pixel array disposed on the CMOS sensor 72 into electric signals which are then output after noises are removed. This output signal is supplied to a signal processing circuit 73 which performs a color process or the like. The processed signal is recorded or transferred by a record/transfer system 74. The recorded or transferred signal is reproduced by a reproducing system 77. The iris 80, CMOS sensor 72 and signal processing circuit 73 are controlled by a timing control circuit 75. The optical system 71, timing control circuit 75, record/transfer system 74 and reproducing system 77 are controlled by a system control circuit 76.

Next, specific structures of a unit cell suitable for use with the image pickup apparatus of any one of the third to seventh embodiments will be described as the tenth embodiment of the invention.

Figure 28:
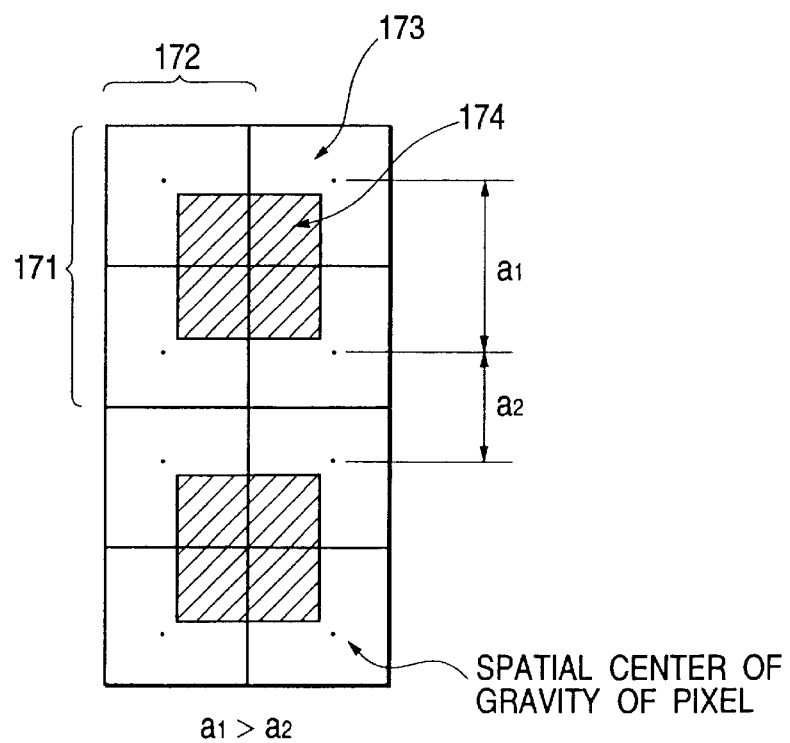
FIG. 28 is a diagram showing an example of a layout of a unit cell of an image pickup apparatus.

The layout of pixels shown in FIG. 28 is associated with the following problem, because of an unequal pitch (a1 is not equal to a2) of the layout of photoelectric conversion portions 173, and hence because of an unequal pitch between adjacent light sensing areas of pixels. The layout of same colors with an unequal pitch results in defects such as a lowered resolution and a moire stripe, since a spatial frequency and a resolution are locally different. A moire stripe poses a critical issue. An image pickup apparatus having such defects cannot be any more a commercial product. A unit cell having five or more pixels is also associated with the same problem.

The present inventors have found that even an image pickup apparatus using a CMOS sensor having amplification means distributed into a plurality of pixels can have a good quality such as an improved opening area without a lowered resolution and a moire stripe, by setting an equal pitch of photoelectric conversion portions and hence an equal distance between adjacent light sensing areas. Such an image pickup apparatus can be properly applied to this invention.

Figure 21:
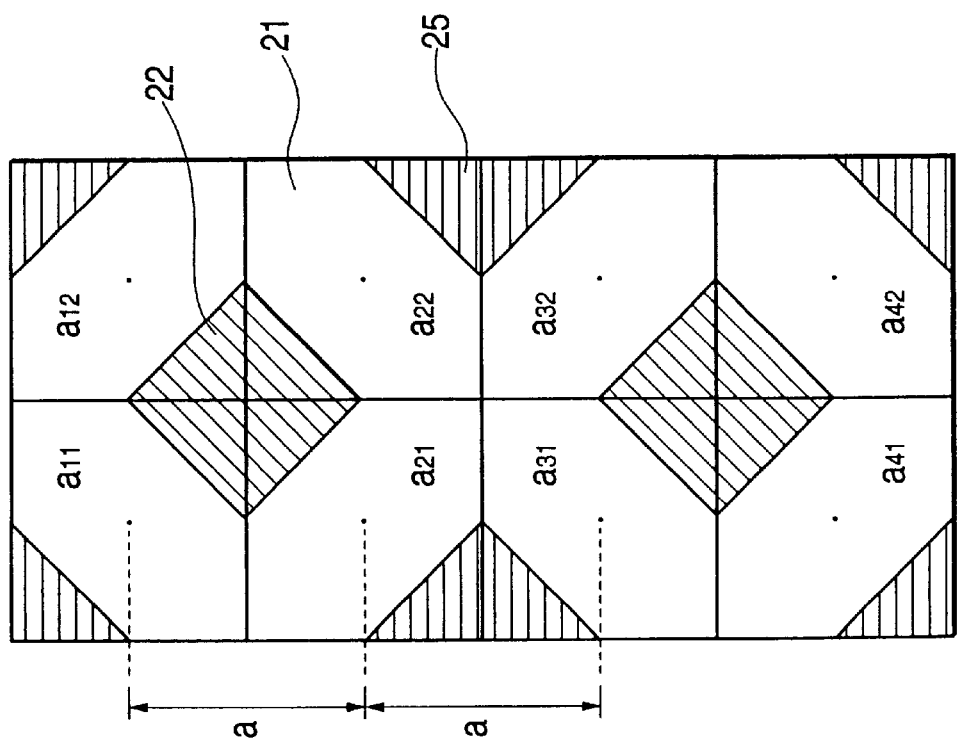
FIG. 21 is a diagram showing a layout of a unit cell according to a tenth embodiment of the invention.

FIG. 21 shows an layout wherein pixels of two row and two columns share a common amplifier 22. In this example shown in FIG. 21, the common amplifier 22 is disposed at the center of the four pixels, four photoelectric conversion portions (A11, A12, a21 and a22) surrounding the common amplifier 22. The common amplifier 22 includes the amplification means MSF, reset means MRES, select means MSEL, and transfer means MTX1 to MTX4, respectively shown in FIG. 5.

A light shielding area 25 is disposed opposite to a partial area of the common amplifier 22 in each pixel area, symmetrical to the center of each pixel area. Therefore, the gravity center of the photoelectric conversion portion of each pixel is at the center of each pixel. The four photoelectric conversion portions (a11 to a22) are therefore disposed at an equal pitch a both in the vertical and horizontal directions.

Figure 22:
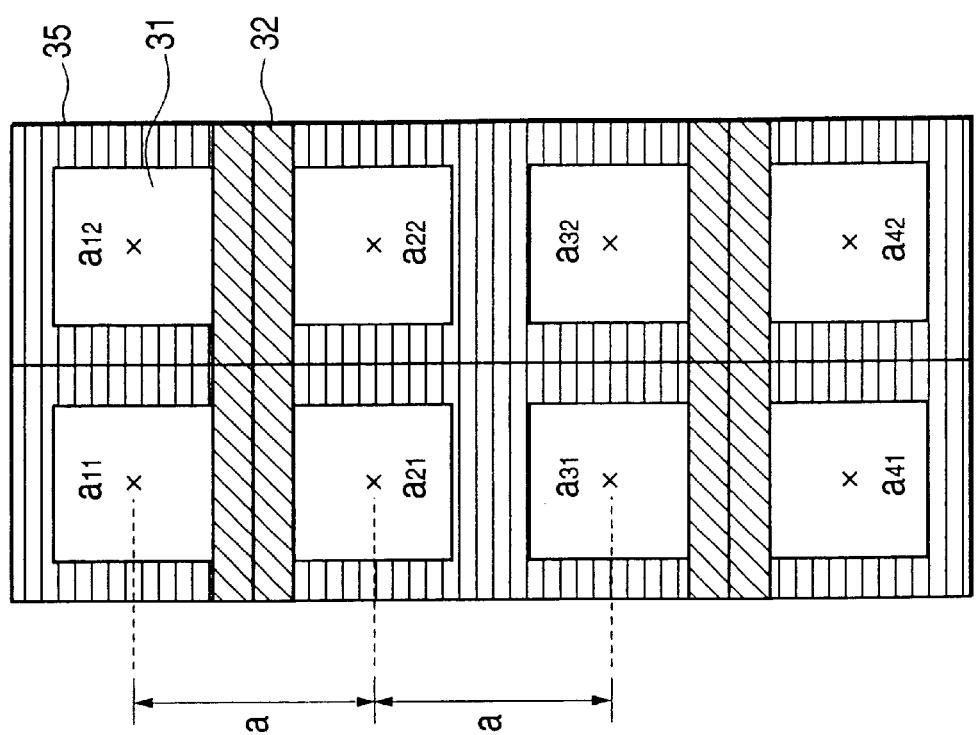
FIG. 22 is a diagram showing another layout of a unit cell according to the tenth embodiment of the invention.

In the layout shown in FIG. 22, a common amplifier 32 is disposed in a central area of the unit cell in the horizontal direction between the upper and lower four pixels. Four photoelectric conversion portions 31 (a11, a12, a21 and a22) sandwich the common amplifier 32.

A light shielding area 35 is disposed opposite to a partial area of the common amplifier 32 in each pixel area, symmetrical to the center of each pixel area. Therefore, the gravity center of the photoelectric conversion portion 31 of each pixel is at the center of each pixel. The four photoelectric conversion portions (a11 to a22) are therefore disposed at an equal pitch a both in the vertical and horizontal directions.

The components in the layout shown in FIG. 22 may be reversed between the vertical and horizonal directions.

Figure 23:
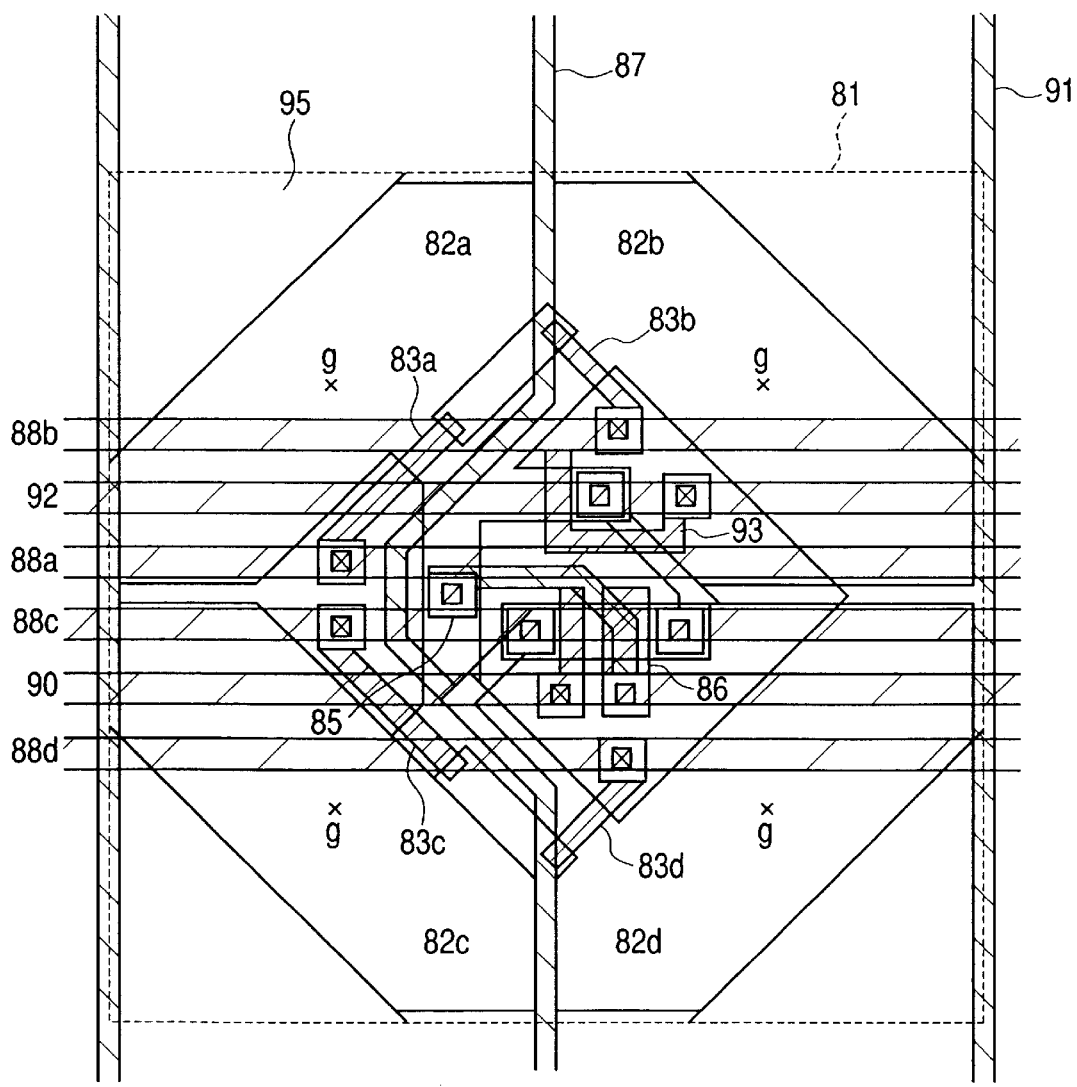
FIG. 23 is a diagram showing an example of a pattern layout according to the tenth embodiment of the invention.

FIG. 23 shows an example of a layout of patterns of a pixel array of a CMOS sensor.

The CMOS sensor shown in FIG. 23 is formed on a single crystal substrate by using a 0.4 μm rule. The size of each pixel is 8 μm square. A common amplifier made of a source follower amplifier is shared by four pixels of two rows and two columns. Therefore, the size of a repetitive unit cell 81 indicated by a broken line is 16 μm square. A two-dimensional array is made of these unit cells.

Photodiodes as photoelectric conversion portions 82a, 82b, 82c and 82d are disposed obliquely in a central area of each pixel area. The upper and lower photodiodes as well as the right and left photodiodes are rotation symmetrical and mirror symmetrical. The gravity center g of each of the photodiodes 82a, 82b, 82c and 82d is at the same relative position. Reference numeral 95 represents a light shielding area.

Reference alphanumeric symbol 88-a represents a scan line for controlling an upper left transfer gate 83-a, reference numeral 90 represents a row select line, and reference numeral 92 represents a reset line for controlling a MOS gate 93.

Signal charges stored in the photodiodes 82a to 82d are supplied via transfer gates 83a to 83d to an FD 85. The size of the MOS gates 83a to 83d is L=0.4 μm and W=1.0 μm, where L is a channel length and W is a channel width.

FD 85 is connected to the input gate 86 of the source follower via an Al wiring line having a width of 0.4 μm. The signal charge transferred to FD 85 modulates the voltage at the input gate 86. The size of the MOS input gate 86 is L=0.8 μm and W=1.0 μm. A sum of capacitances of FD 85 and input gate 86 is about 5 fF. Since Q=CV, the voltage at the input gate 86 changes by 3.2 V assuming that $10^5$ electrons are accumulated.

A current flowing from the $V_{DD}$ terminal 91 is modulated by the voltage at the input gate 86 and then flows out to a vertical output line 87. The current flowing out to the vertical output line 87 is processed by an unrepresented signal processing circuit and eventually becomes an image signal.

Thereafter, a MOS gate 93 connected to the reset line 92 is opened (at this time, the transfer gates 83a to 83d are also opened) to short the photodiodes 82a to 82d, FD 85 and input gate 86 to the $V_{DD}$ terminal in order to set potentials of these elements to $V_{DD}$.

Thereafter, the transfer gates 83a to 83d are closed to again start the charge accumulation by the photodiodes 82a to 82d.

All wiring lines 88a to 88d, 90 and 92 extending in the horizontal direction are made of transparent conductor ITO (Indium Tin Oxide) having a thickness of 1500 angstroms, and light can transmits through the wiring lines on the photodiodes 82a to 82d. It is to be noted that the gravity center g of each photodiode is at the gravity center of the light sensing area of each pixel.

With this layout, a CMOS sensor having a relatively high area factor and large opening area can be provided because of the equal pitch of the photoelectric conversion portions.

Figure 24:
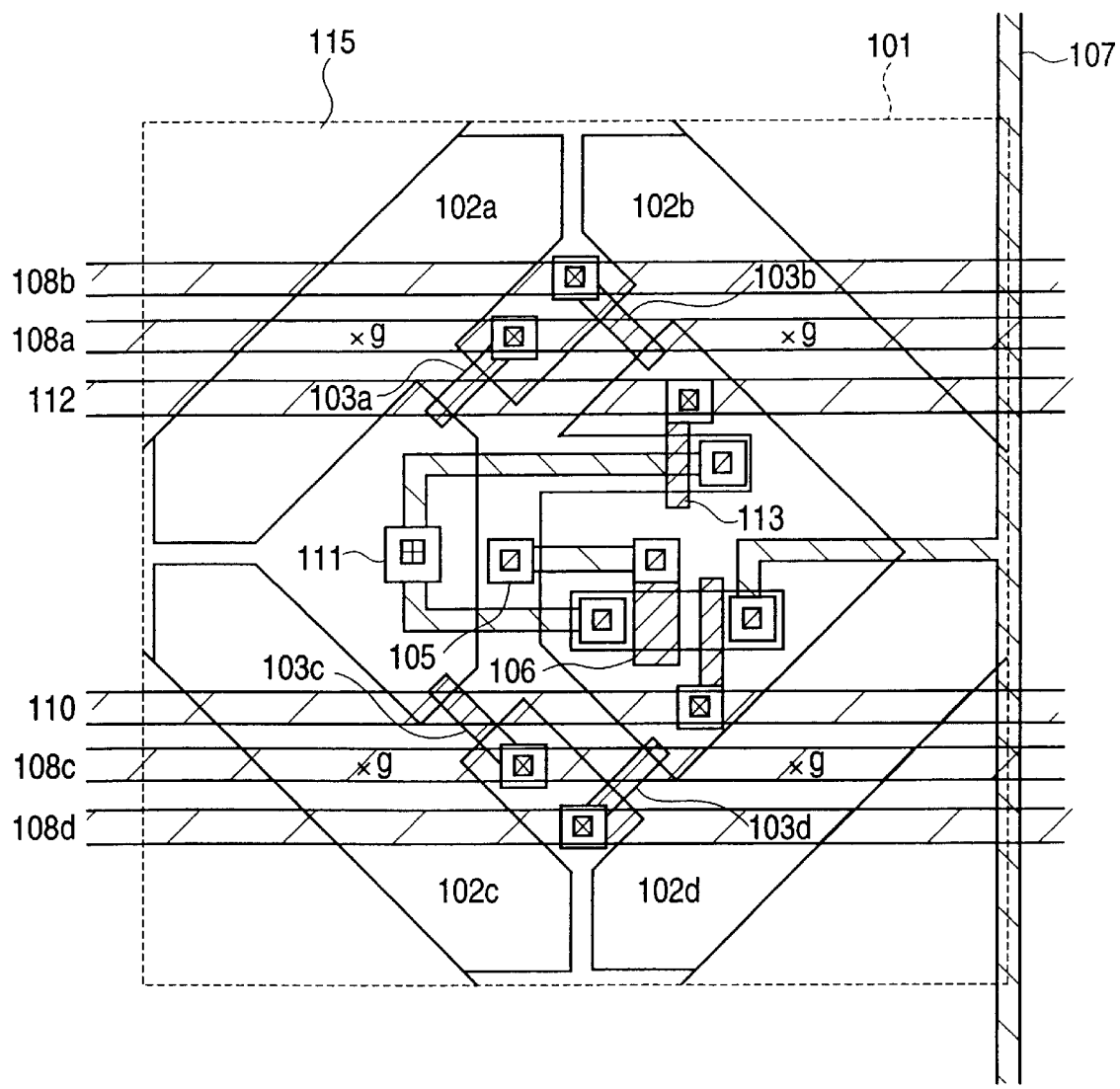
FIG. 24 is a diagram showing another example of a pattern layout according to the tenth embodiment of the invention.

FIG. 24 shows another example of a layout of patterns of a pixel array of a CMOS sensor.

Referring to FIG. 24, reference alphanumeric symbols 102a to 102d represent photodiodes, 103a to 103d represent transfer gates, 105 represents an FD, 106 represents an input gate of a source follower, 107 represents a vertical output line, 108a to 108d represent scan lines, 110 represents a row select line, and 112 represents a reset line for controlling a MOS gate 113.

In this layout, three of the wiring lines 108a to 108d, 110 and 112 extending in the horizontal direction traverse the central area of each pixel. Therefore, even if they are made of metal wiring layers intercepting incidence light upon the photodiodes 102a to 102d, the gravity center g of the light sensing area does not shift so that the gravity center g is at the center of the pixel area.

With this layout, since usual opaque metal having a small electric resistance can be used, the time constant of a wiring layer extending in the horizontal direction can be improved so that an image pickup apparatus capable of operating at higher speed can be provided.

Figure 25:
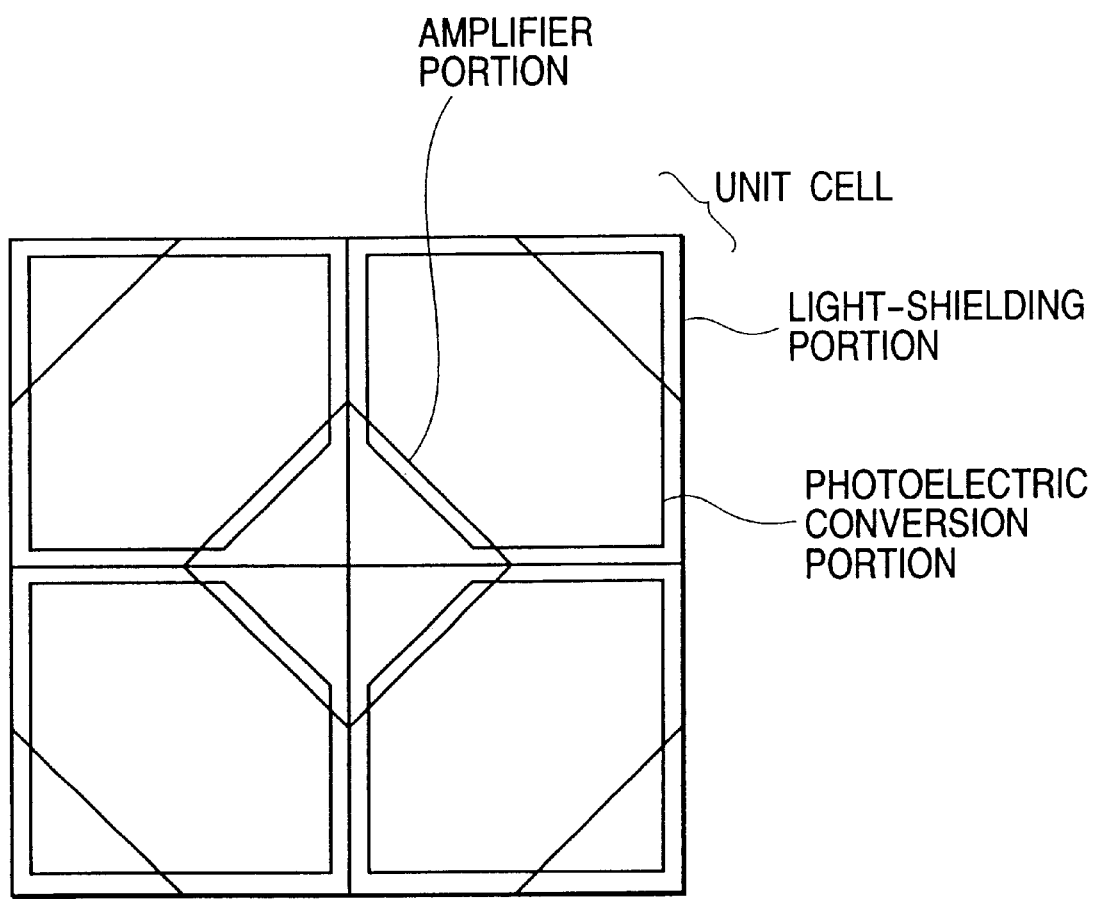
FIG. 25 is a diagram showing an example of the structure of a unit cell according to the tenth embodiment of the invention.

With the above-described layouts, the light shielding area is effectively used. This light shielding area may be used as a charge storage area by forming a photodiode as a photoelectric conversion portion under the light shielding area, as shown in FIG. 25.

Figure 26:
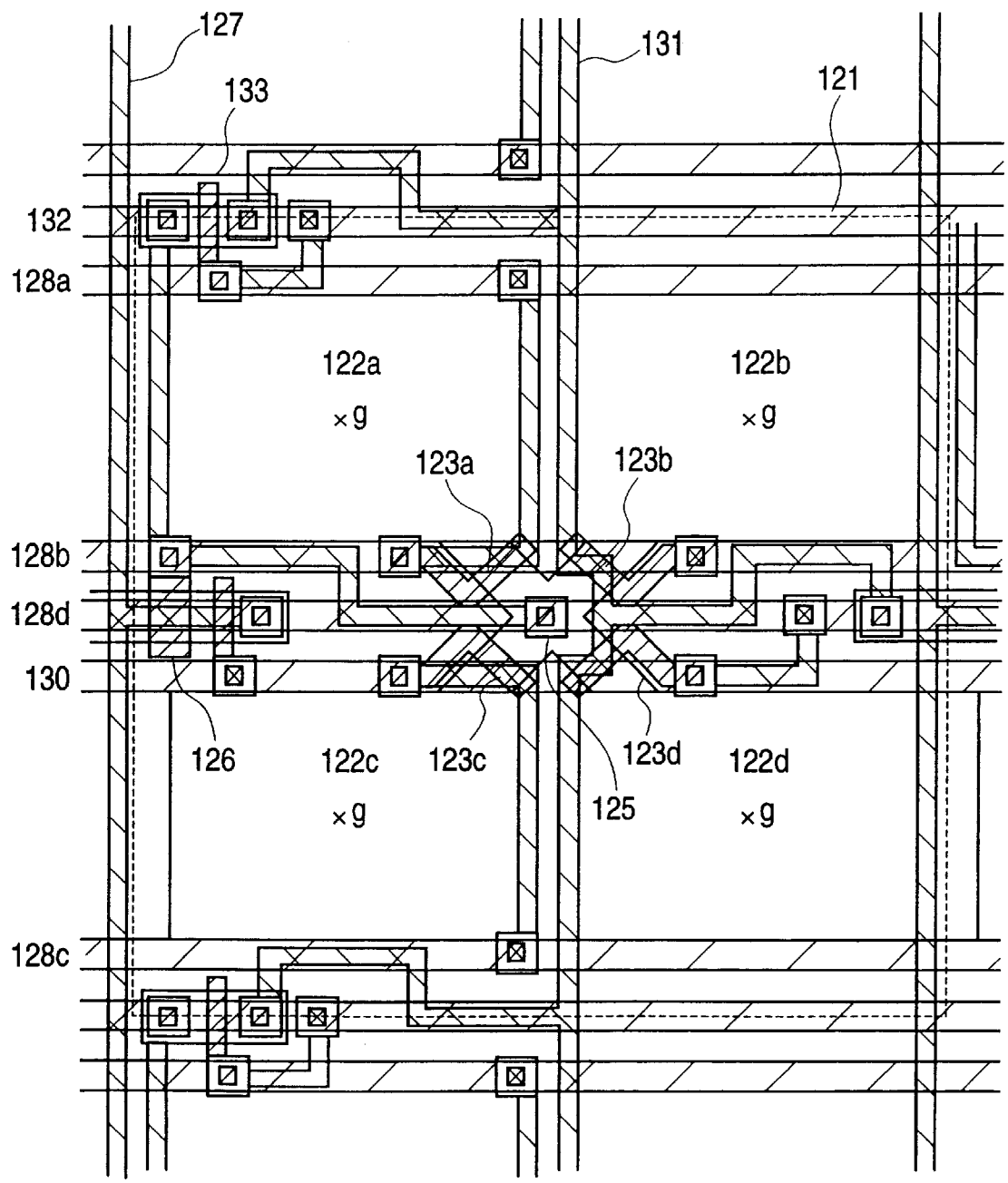
FIG. 26 is a diagram showing another example of a pattern layout according to the tenth embodiment of the invention.

In the layout of the second example, since the wiring lines traverse the central area of the pixel where the light converging efficiency is best, there is a possibility of lowering the sensitivity of the image pickup apparatus to some degree. An improved layout capable of solving this problem is shown in FIG. 26.

In this layout, all of transfer gates 123a to 123d, an FD 125, an input gate 126 of each source follower, and each reset MOS gate 133 are formed under wiring lines (scan lines 128a to 128d, a row select line 130, a reset line 132) extending in the horizontal direction. Therefore, the area of the photodiodes 122a to 122d and their opening area can be made maximum. The openings of pixels can exist continuously with each other. The light shielding area is formed in the horizontal and vertical wiring line areas.

With this layout, the source follower amplifier and reset MOS transistor are divisionally disposed in a peripheral area of each pixel along the horizontal direction so that they can be disposed under the horizontal wiring lines in a compact size.

Since there is some space under the wiring in the upper right pixel area, new components such as smart sensors may be formed in this space.

With this layout, since the area of the photodiodes and their opening factor can be made large, an image pickup apparatus having a wide dynamic range and a high sensitivity can be provided. Even if the size of an opening of a photodiode is reduced in the order of light wavelength in the future by advanced micro patterning techniques, this layout will still allow light to enter, during a long period in the future.

Figure 27:
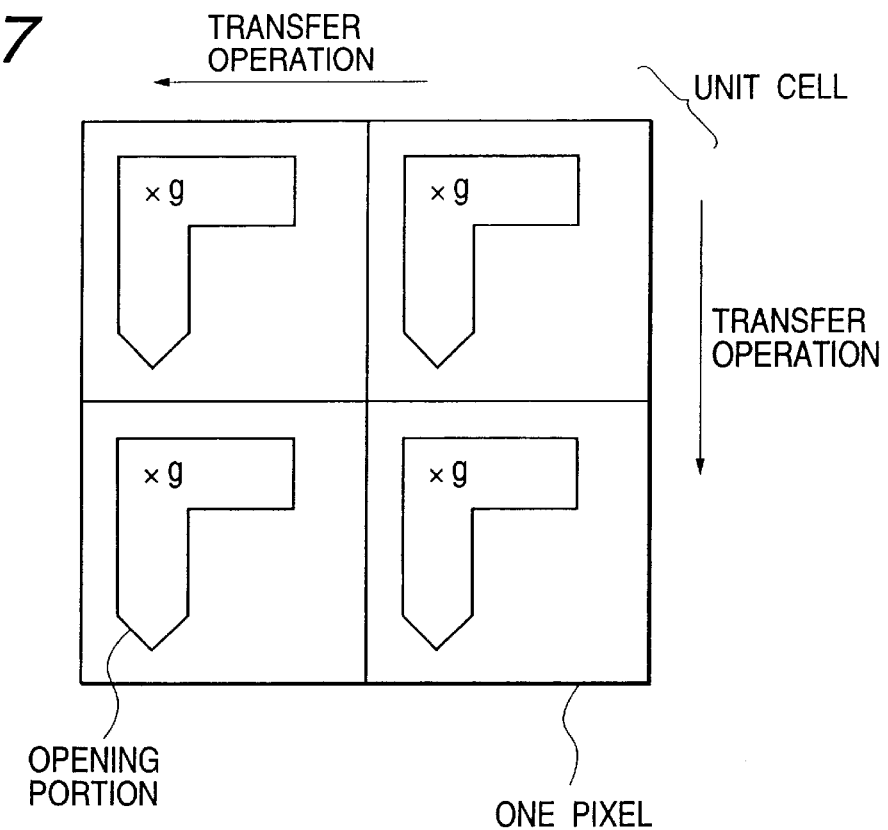
FIG. 27 is a diagram showing another example of the structure of a unit cell according to the tenth embodiment of the invention.

With the layouts described so far, the gravity of the light sensing area is made at the center of the pixel area by disposing the unit cell as amplification means in the central area of the unit cell. These layouts are not limitative, but other layouts may be used. For example, as shown in FIG. 27, opening portions may be disposed in translation symmetry.

Since the opening portions are disposed in translation symmetry, the light sensing areas are formed at an equal pitch.

In the above embodiments, although the common circuit is made of an amplifier, other signal processing circuits such as an A/D converter circuit and a compression circuit may also be used.

Many widely different embodiments of the present invention may be constructed without departing from the spirit and scope of the present invention. It should be understood that the present invention is not limited to the specific embodiments described in the specification, except as defined in the appended claims.

What is claimed is:

1. An image pickup apparatus including a plurality of photoelectric conversion portions which are arranged two-dimensionally in row and column directions so as to arrange a plurality of unit cells, each of which includes at least two photoelectric conversion portions arranged in the row direction and a common circuit to which signals from the at least two photoelectric conversion portions are input, said image pickup apparatus comprising:

a plurality of noise removal circuits, each of which is provided in common to at least two columns of the photoelectric conversion portions to remove a noise component included in an image signal from the unit cell;

a plurality of signal holding means which are arranged so that the same number of the signal holding means as that of the columns of the photoelectric conversion portions, connected in common to the noise removal circuit, are provided to each noise removal circuit to hold the image signals output from the noise removal circuit;

a common output line to which signals from said plurality of signal holding means are read out sequentially; and a scanning circuit which is arranged to cause said plurality of signal holding means to output the signals therefrom to said common output line.

2. An image pickup apparatus comprising:

a plurality of photoelectric conversion pixels arranged two-dimensionally in row and column directions;

a plurality of noise removal circuits, each of which is provided in common to at least two columns of the photoelectric conversion pixels to remove noise components included in image signals from the photoelectric conversion pixels;

a plurality of signal holding means which are arranged so that the same number of the signal holding means as that of the columns of the photoelectric conversion pixels connected in common to the noise removal circuit, are provided to each noise removal circuit to hold the image signals output from the noise removal circuit;

a common output line to which signals from said plurality of signal holding means are read out sequentially; and a scanning circuit which is arranged to cause said plurality of signal holding means to output the signals therefrom to said common output line.

3. An apparatus according to claim 1, wherein the common circuit includes an amplifier to which the signals from the at least two photoelectric conversion portions are input, and a reset switch which resets an input portion of the amplifier.

4. An apparatus according to claim 1, further comprising:

a lens which focuses light onto the photoelectric conversion portion;

an analog-digital conversion circuit which converts the signal output from said common output line into a digital signal; and a signal processing circuit which effects a color processing of the signal output from said analog-digital conversion circuit.

5. An apparatus according to claim 2, wherein the photoelectric conversion pixel includes a photoelectric conversion portion, an amplifier to which the signal from said photoelectric conversion portion is input, and a reset switch which resets an input portion of the amplifier.

6. An apparatus according to claim 2, further comprising:

a lens which focuses light onto the photoelectric conversion pixel;

an analog-digital conversion circuit which converts the signal output from said common output line into a digital signal; and a signal processing circuit which effects a color processing of the signal output from said analog-digital conversion circuit.

* * * * *

UNITED STATES PATENT AND TRADEMARK OFFICE
CERTIFICATE OF CORRECTION

PATENT NO.     : 6,734,906 B1
DATED          : May 11, 2004
INVENTOR(S)    : Seiji Hashimoto It is certified that error appears in the above-identified patent and that said Letters Patent is hereby corrected as shown below:

<u>Title page, Item [54] and Column 1, line 3,</u>
Title, "TWO" should read -- TWO- --.

<u>Column 2,</u>
Line 43, "aspect" should read -- an aspect --; and
Line 58, "apsect" should read -- aspect --.

<u>Column 5,</u>
Line 53, "resister" should read -- register --.

<u>Column 8,</u>
Line 24, "apparats." should read -- apparatus. --
Line 40, "sell" should read -- cell --; and
Line 66, "lines" should read -- of lines --.

<u>Column 9,</u>
Line 3, "different" should read -- a different --.

<u>Column 10,</u>
Line 33, "apparats" should read -- apparatus --; and
Line 49, "sell" should read -- cell --.

<u>Column 12,</u>
Line 15, "an layout" should read -- a layout --.

<u>Column 13,</u>
Line 32, "transmits" should read -- transmit --.

UNITED STATES PATENT AND TRADEMARK OFFICE
CERTIFICATE OF CORRECTION

PATENT NO. : 6,734,906 B1
DATED : May 11, 2004
INVENTOR(S) : Seiji Hashimoto

It is certified that error appears in the above-identified patent and that said Letters Patent is hereby corrected as shown below:

Column 14,
Line 20, "may" should read -- may be --.

Signed and Sealed this

Fourteenth Day of September, 2004

JON W. DUDAS
*Director of the United States Patent and Trademark Office*